United States Patent
Hébert et al.

(10) Patent No.: US 9,882,049 B2
(45) Date of Patent: Jan. 30, 2018

(54) SELF-ALIGNED SLOTTED ACCUMULATION-MODE FIELD EFFECT TRANSISTOR (ACCUFET) STRUCTURE AND METHOD

(71) Applicants: François Hébert, San Mateo, CA (US); Madhur Bobde, San Jose, CA (US); Anup Bhalla, Santa Clara, CA (US)

(72) Inventors: François Hébert, San Mateo, CA (US); Madhur Bobde, San Jose, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/507,311

(22) Filed: Oct. 6, 2014

(65) Prior Publication Data

US 2016/0099351 A1    Apr. 7, 2016

(51) Int. Cl.
| | |
|---|---|
| H01L 29/739 | (2006.01) |
| H01L 29/78 | (2006.01) |
| H01L 29/66 | (2006.01) |
| H01L 29/06 | (2006.01) |
| H01L 21/265 | (2006.01) |
| H01L 29/417 | (2006.01) |
| H01L 29/45 | (2006.01) |

(Continued)

(52) U.S. Cl.
CPC ...... *H01L 29/7828* (2013.01); *H01L 29/0619* (2013.01); *H01L 29/0623* (2013.01); *H01L 29/66666* (2013.01); *H01L 29/7806* (2013.01); *H01L 21/26586* (2013.01); *H01L 29/0847* (2013.01); *H01L 29/41766* (2013.01); *H01L 29/456* (2013.01); *H01L 29/47* (2013.01)

(58) Field of Classification Search
CPC .......... H01L 29/7828; H01L 21/28026; H01L 29/66666; H01L 29/4236
USPC ................ 257/218, 329–331, 339, 341, 342, 257/E29.201, E29.257, E29.26
See application file for complete search history.

(56) References Cited

U.S. PATENT DOCUMENTS 5,581,100 A * 12/1996 Ajit ..................... H01L 29/0696
257/331
5,854,500 A * 12/1998 Krautschneider ..... H01L 27/108
257/300

(Continued)

*Primary Examiner* — Marc Armand
*Assistant Examiner* — Sue Tang
(74) *Attorney, Agent, or Firm* — Bo-In Lin

(57) ABSTRACT

This invention discloses a semiconductor power device disposed in a semiconductor substrate. The semiconductor power device includes trenched gates each having a stick-up gate segment extended above a top surface of the semiconductor substrate surrounded by sidewall spacers. The semiconductor power device further includes slots opened aligned with the sidewall spacers substantially parallel to the trenched gates. The stick-up gate segment further includes a cap composed of an insulation material surrounded by the sidewall spacers. A layer of barrier metal covers a top surface of the cap and over the sidewall spacers and extends above a top surface of the slots. The slots are filled with a gate material same as the gate segment for functioning as additional gate electrodes for providing a depletion layer extends toward the trenched gates whereby a drift region between the slots and the trenched gate is fully depleted at a gate-to-drain voltage Vgs=0 volt.

3 Claims, 44 Drawing Sheets

(51) Int. Cl.
    *H01L 29/47*           (2006.01)
    *H01L 29/08*           (2006.01)

(56) References Cited

U.S. PATENT DOCUMENTS

| | | | |
|---|---|---|---|
| 6,717,210 B2* | 4/2004 | Takano | H01L 29/7813 257/330 |
| 6,943,408 B2* | 9/2005 | Wu | H01L 29/7813 257/329 |
| 2002/0115257 A1* | 8/2002 | Inagawa | H01L 29/7827 438/270 |
| 2006/0267090 A1* | 11/2006 | Sapp | H01L 29/7827 257/341 |
| 2009/0008674 A1* | 1/2009 | Udrea | H01L 29/0696 257/138 |

\* cited by examiner

SELF-ALIGNED SLOTTED ACCUMULATION-MODE FIELD EFFECT TRANSISTOR (ACCUFET) STRUCTURE AND METHOD

BACKGROUND OF THE INVENTION

1. Field of the Invention

The invention relates generally to the vertical semiconductor power devices. More particularly, this invention relates to configurations and manufacturing methods for providing a self-aligned accumulation-mode field-effect transistor (AccuFET) with ultra-small pitch to achieve a high power density with minimized parasitic bipolar actions for high device ruggedness while simplified manufacturing process to produce low cost semiconductor power devices suitable for implementation with both N and P-channel configurations.

2. Description of the Prior Art

Conventional manufacturing technologies and device configuration encounter several technical difficulties when the cell pitch of the trench-DMOS devices is further reduced. Specifically, the device structure is weakened due to the increase of the parasitic bipolar actions. As the cell pitch becomes smaller, it is difficult to form effective body contact with low resistance. The increase in the resistance of the body region due to the difficulties of smaller dimensions available for the contact areas further results the increased parasitic bipolar current gain. For NMOS devices, the increased parasitic bipolar actions weakened the devices and prevent the devices to achieve a high UIS rating.

A device implemented with the accumulation mode field effect transistors has the benefits that there is no parasitic bipolar structure because there are no P-body regions for the NMOS device. For an N-channel device, an enhancement mode of operation can be achieved by using a P+ doped gate combined with appropriately selected epitaxial doping and gate to gate spacing to achieve a fully depleted channel region with no conduction when the gate-to-drain voltage Vgs is at zero volt. Baliga et al. disclosed the configuration of an AccuFET device in an article entitled "The Accumulation-Mode Field-effect Transistor: A new Ultra Low On-Resistance MOSFET" (IEEE EDL, August 1992, Page 427).

Additional disclosures for the AccuFET devices were made in different US Patents, such as U.S. Pat. No. 4,903,189 with a device configuration shown in FIG. 1A. Another device configuration shown in FIG. 1B is disclosed in U.S. Pat. No. 5,581,100. Furthermore, U.S. Pat. No. 5,844,273 discloses different AccuFET device configurations shown in FIG. 1C. However, these disclosures for manufacturing the AccuFET devices still have limitations that a small cell pitch with short channel vertical AccuFET configuration cannot be achieved. Additionally, for certain applications, an integration of an efficient body structure within the device with a negatively biased drain is desirable. However, conventional configurations and methods of manufacturing the AccuFET devices cannot satisfy such demands.

Therefore, a need still exists in the art of power semiconductor device design and manufacture to provide new device configurations and methods of manufacturing the AccuFET devices such that the above discussed problems and limitations can be resolved.

SUMMARY OF THE PRESENT INVENTION

It is therefore an aspect of the present invention to provide a new and improved device structure and methods of manufacturing a self-aligned slotted AccuFET device with self-aligned short channel having smaller cell pitch by applying manufacturing methods compatible with standard foundry processes such that the above discussed limitations and difficulties can be resolved.

Specifically, it is an aspect of the present invention to provide a new and improved device structure and methods of manufacturing a self-aligned slotted AccuFET device with polysilicon stick-up gates formed with sidewall spacers and nitride gate cap to define and align the location and dimension of the slots thus achieving small cell pitches.

It is another aspect of the present invention to provide a new and improved device structure and methods of manufacturing a self-aligned slotted AccuFET device with self-aligned threshold control slots and with elimination of the parasitic bipolar latch-up to achieve high ruggedness under all operating conditions and to maximize the safe operating area (SOA) of the power device.

It is another aspect of the present invention to provide a new and improved device structure and methods of manufacturing a self-aligned slotted AccuFET device with polysilicon stick-up gates formed with sidewall spacers and nitride gate cap to define and align the location and dimension of the slots. Furthermore, the slots may have different embodiments including but not limited to implementing the slots as Schottky slots, oxide slots and doped polysilicon slots to satisfy requirements of different applications.

Briefly in a preferred embodiment this invention discloses a semiconductor power device disposed in a semiconductor substrate. The semiconductor power device includes trenched gates each having a stick-up gate segment extended above a top surface of the semiconductor substrate surrounded by sidewall spacers. The semiconductor power device further includes slots formed in the channel region between gates and aligned with the sidewall spacers substantially parallel to the trenched gates. The stick-up gate segment further includes a cap composed of an insulation material surrounded by the sidewall spacers. A layer of barrier metal covers a top surface of the cap and over the sidewall spacers and extends above a top surface of the slots. The slots are filled with a gate material same as the gate segment for functioning as additional gate electrodes for providing a depletion layer extends toward the trenched gates whereby a drift region between the slots and the trenched gate is fully depleted at a gate-to-drain voltage Vgs=0 volt.

Furthermore, this invention discloses a method for manufacturing a semiconductor power device disposed in a semiconductor substrate. The method includes a step of forming trenched gates with a stick-up gate segment extended above a top surface of the semiconductor substrate surrounded by sidewall spacers. The method further includes a step of applying a self-aligned etching process to open slots aligned with the sidewall spacers substantially parallel to the trenched gates.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
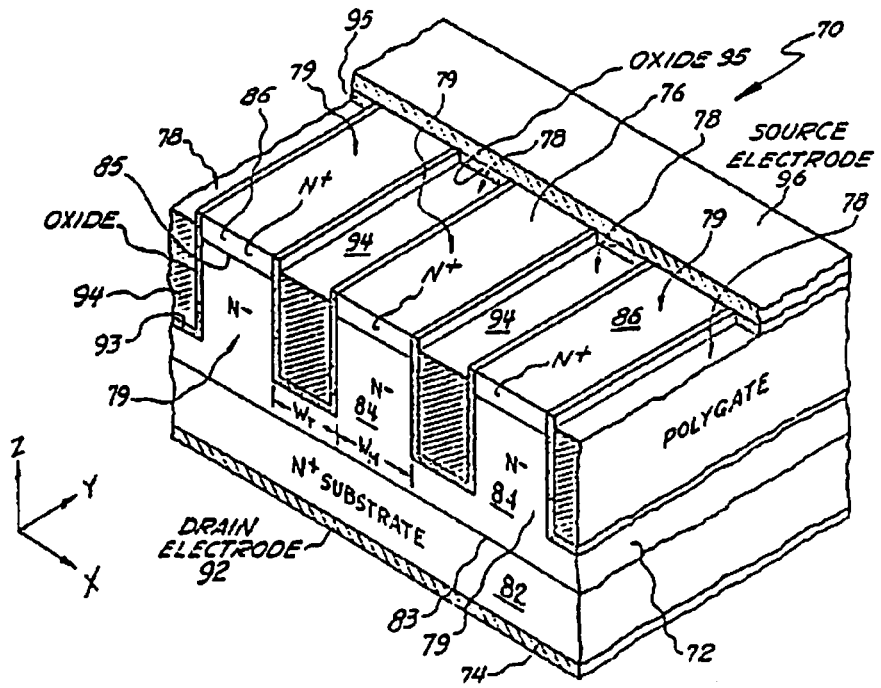
FIGS. 1A to 1C are cross sectional views for showing conventional AccuFET power device configurations manufactured by conventional methods.
Figure 1B:
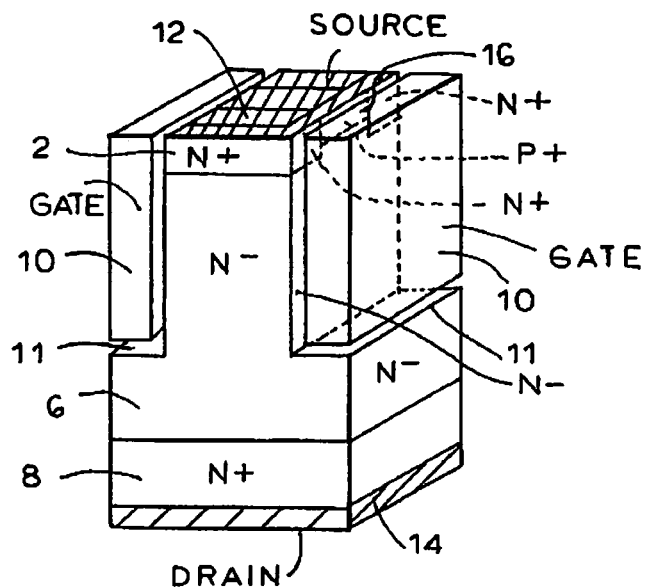
Figure 1C:
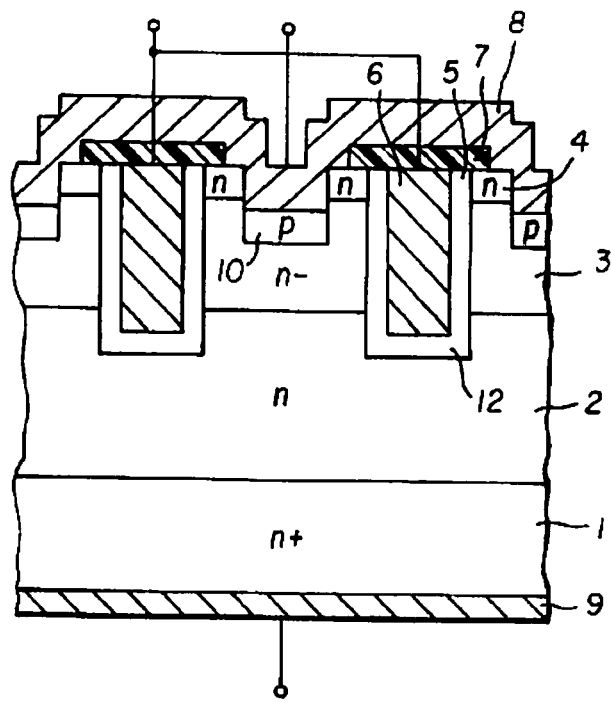
Figure 2:
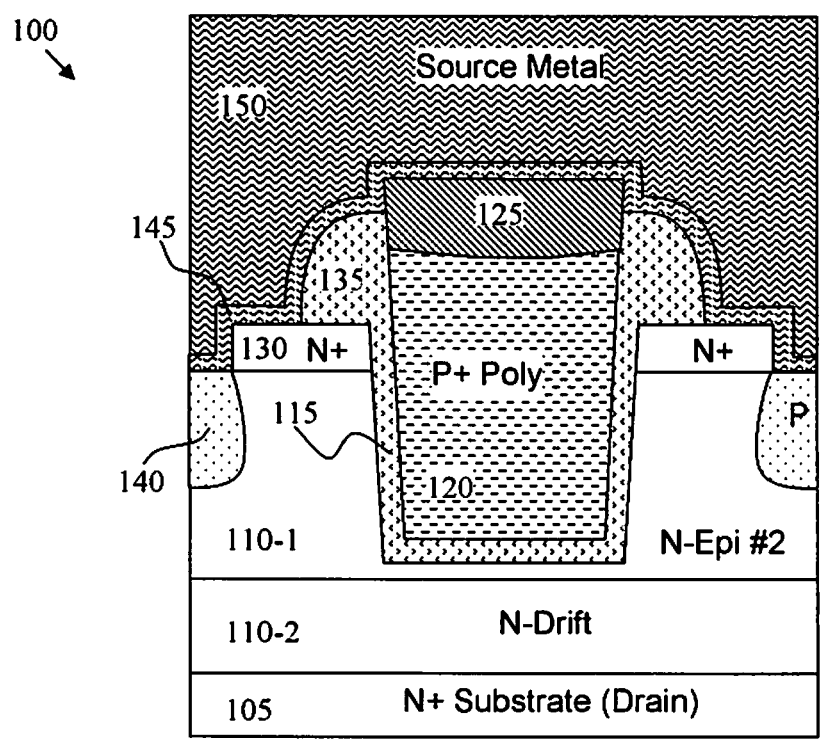
FIGS. 2 to 7 are cross sectional views of the self-aligned slotted AccuFET power devices of this invention.

Referring to FIG. 2 for a cross sectional view of an accumulation mode field effect transistor (AccuFET) device 100 with shallow implant slots of this invention. The AccuFET device 100 is supported on an N+ silicon substrate 105 functioning as a drain terminal or electrode on a bottom surface of the substrate. The N+ substrate 105 supports a N-drift region 110-2 formed as a first epitaxial layer immediately on top of the N+ drain region 105. A second N-epitaxial layer 110-1 is supported on top of the drift region 110-2. The AccuFET device 100 includes a plurality of trenched gates filled with a polysilicon layer 120. In an exemplary embodiment, for an N-channel device, the trench gate is filled with a P-doped polysilicon layer 120. Each of the trenched polysilicon gates is covered with a nitride cap 125 with sidewalls of the trenches padded with a gate oxide layer 115. Nitride is selected since it is a dielectric material with a different etch rate than oxide layers. Other dielectric materials with different etch rate than oxide can also be considered such as oxynitride, etc. . . . . The polysilicon layer 120 extends above the top surface of the substrate covered with the nitride cap 125 are surrounded by a spacer layer 135.

The AccuFET device 100 further includes N+ source regions 130 surrounding the trenched gate 120 near the top surface of the substrate and extended laterally beyond the substrate area underneath the spacer 135 to contact the P-type slot regions 140 formed in the second epitaxial layer 110-1 underneath a slot opened between the spacer layer 135. As will be further discussed below in the descriptions of the manufacturing processes that the slots are formed by applying a dry etch process taking advantage of the self-alignment between the spacers 135 thus achieving a slot dimension much less than the minimum critical dimension (CD) of the process. The P-slot regions 140 are implanted through the slots. A barrier layer 145 is formed covering the exposed top surface of the source regions 130 and the slot regions 140 through the top surface of the slots thus enhancing the source contact to the source metal 150.

The AccuFET device 100 as shown in FIG. 2 thus provides a vertical AccuFET structure that has trench gates with self-aligned slots for a threshold voltage control. Each of the slots influences the threshold voltage of the device by acting as a second gate electrode embedded in the channel. The second gate electrode is parallel to the trench-gate electrode providing a depletion layer. The depletion layer extends away from the slot towards the other depletion layer originated from the trench-gate polysilicon electrode. For enhancement mode operation, the key is to have the second epitaxial layer 110-1 region fully depleted at a Vgs=0V. However, the doping concentration of the second epitaxial layer 110-1 is maximized in order to minimize the resistance. A higher dopant concentration of the second epitaxial layer 110-1 challenges the goal of achieving a fully depleted region (110-1) at Vgs=0V. In order to achieve this goal, the width of the region must become very small that may impact the device manufacturability. Adding the slot as additional gate electrodes enables the use of a wider silicon region between trench-gate electrodes, while maximizing the doping concentration of the second epitaxial layer 110-1. Standard 20-30V AccuFET without a slot may need a "mesa width", i.e., silicon width between trenches, of only 0.2 microns, and the doping would have to be in the 1E15 to 2E15 or so. By using a slot, the "mesa" width can be increased to approximately 0.4 um. The increased mesa width is more easy and convenient to manufacture and the doping can be raised significantly to a range of up to about 1E16 range. A device is provided to achieve the design goals of minimizing pitch and maintaining an enhancement mode of operation.

The vertical self-aligned structure of the slotted trench gates is achieved by taking advantage of the trenched gate with stick-up polysilicon gates 120 surrounded by sidewall spacers 135 for defining the locations and dimensions of the slots. The details of the self-alignment are more specifically described below in FIGS. 10 to 15 in describing various embodiments and the manufacturing processes of the AccuFET devices of this invention. The structures as disclosed for various embodiments of the AccuFET devices provide self-aligned short channel in the vertical AccuFET structures having small cell pitch. The device and the processes of manufacturing are compatible with standard foundry processes and can be produced with low and economical manufacturing cost. The device structure provides further advantages of integrating an efficient body structure with the device when the drain is negatively biased that is especially advantageous for certain applications. For example, in switching applications such as DC to DC power conversion using typical DC-to-DC converter. The DC-to-DC converter has a high-side MOSFET, low-side MOSFET and an inductor connected between the drain of the low side implemented as an output terminal and the load. The current flow can reverse through the low-side device, by flowing through the body diode of the low-side MOSFET. For increased efficiency, Schottky diodes are preferred to minimize the forward conduction losses. Efficient Schottky structures can be integrated in the Slotted AccuFET structures as discussed here and further described later in different embodiments. More detailed and specific benefits of such applications are discussed, for example, in the Maxim Application notes (http://www.maxim-ic.com/appnotes.cfm/appnote_number/2031).

Figure 3:
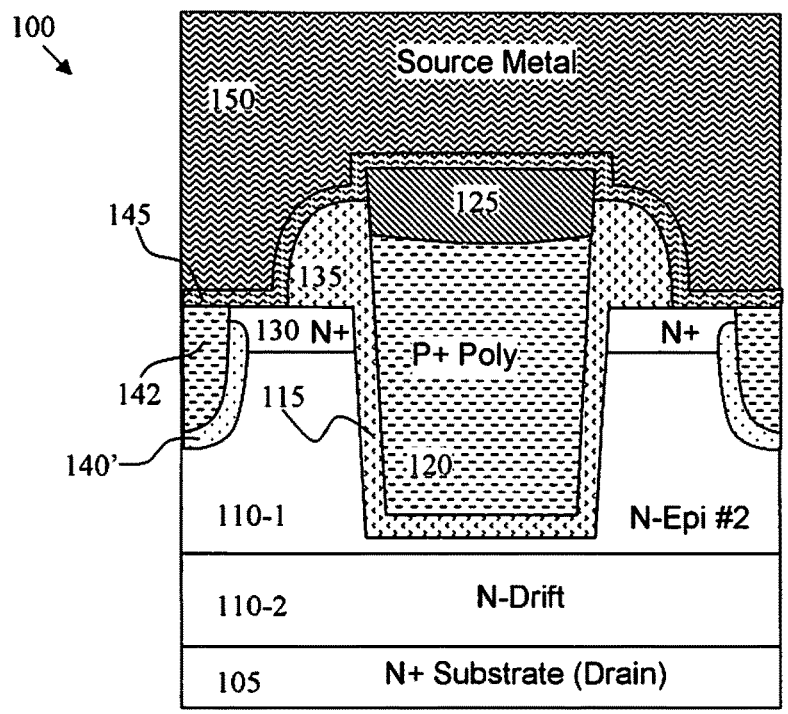

FIG. 3 is a cross section for showing another exemplary embodiment of an AccuFET device of this invention. FIG. 3 shows an AccuFET device that is similar to the device shown in FIG. 2 except that the slot regions 140' are formed along the sidewalls of the slots between the gate sidewall spacers 135 with the slots filled with P-doped polysilicon 142. The key features of this embodiment are that the slots are doped in a self-aligned fashion by using doped polysilicon, e.g., the P-doped polysilicon, deposited in narrow slots etched in a self-aligned fashion along the periphery of the stick-up polysilicon trench-gates. The slots can be planarized (filled to improve the planarity of the structure) using the doped polysilicon.

Figure 4:
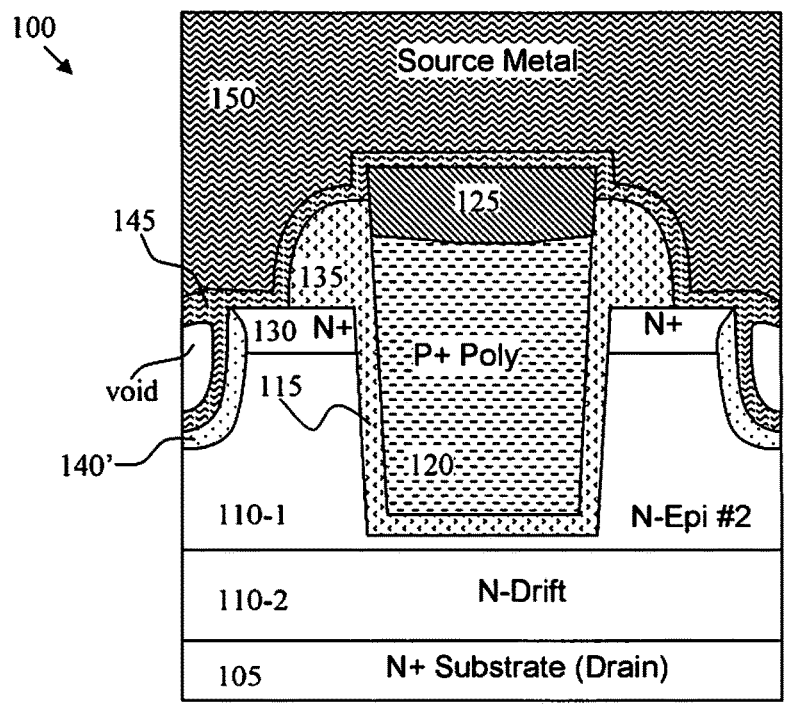

FIG. 4 is a cross section for showing another exemplary embodiment of an AccuFET device of this invention. FIG. 4 shows an AccuFET device that is similar to the device shown in FIG. 2 except that the slots are formed as open slots and P-doped regions 140' are formed along the sidewalls of the slots between the gate sidewall spacers 135. Furthermore, the barrier metal layer 145 extends inside the slot gate regions depending on the width of the slots. The barrier metal layer 145 is composed of Ti/TiN barrier metal. This embodiment enables the realization of a slot structure that is contacted directly by the source metal. The source metal may be implemented either with Schottky metal when the P-dopant 140' is light. Alternately, the source metal may be ohmic metal when the P-dopant 140' is heavily doped. Adjusting the dopant level of 140' can therefore adjust the barrier height of the Schottky slot region. An additional advantage is that the process is simplified by eliminating the need for filling the slot prior to metal deposition.

Figure 5:
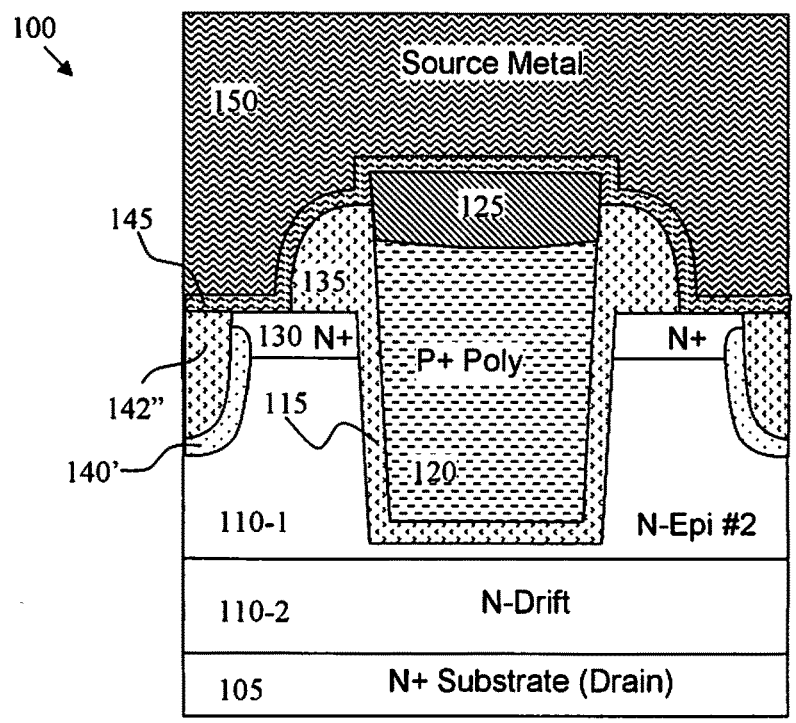

FIG. 5 is a cross section for showing another exemplary embodiment of an AccuFET device of this invention. FIG. 5 shows an AccuFET device that is similar to the device shown in FIG. 2 except that the P-doped slot regions 140' are formed along the sidewalls of the slots between the gate sidewall spacers 135. Furthermore, slot gate regions are filled with an insulation material to form slot gate insulation regions 142" so that the source electrode made of source metal 150 and barrier metal 145 does not contact the P-doped slot gate regions 140'. The barrier metal layer 145 covers the slot gate insulation regions 142". The slot gate regions 140' are maintained at a floating state with no contact to the source metal 150. This embodiment ensures that the slot region 140' is effectively isolated from the source metal by insulating region 142". The benefit is to achieve a reduced leakage since the P-region 140' is not connected to the source metal 150.

Figure 6:
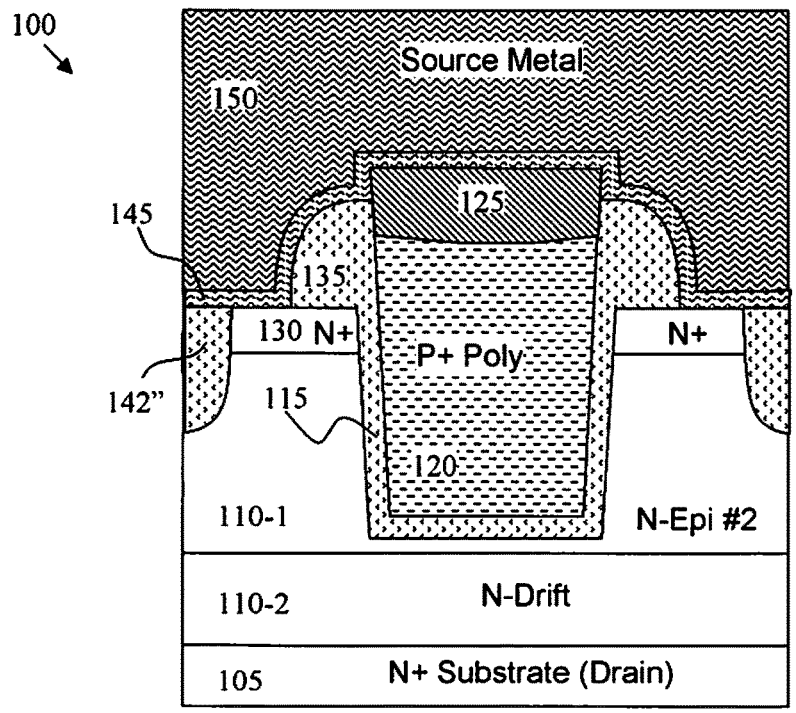

FIG. 6 is a cross section for showing another exemplary embodiment of an AccuFET device of this invention. FIG. 6 shows an AccuFET device that is similar to the device shown in FIG. 2 except that the slots between the spacers 135 are now filled with oxide and become oxide slot regions 142". Therefore, the oxide slots 142" has no electrically communication with the source regions 130 and function as channel stop with the active mesa structure. This embodiment features an insulated slot that has low leakage since there is no P doped region. The oxide slots 142' act as a field termination to maintain an adequate threshold voltage for the depletion region with the depletion region extends from the trench-gate polysilicon electrode.

Figure 7:
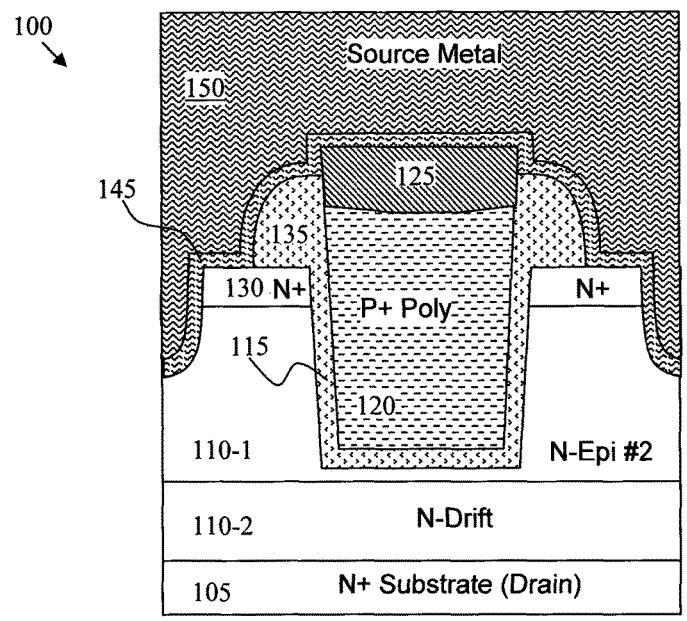

FIG. 7 is a cross section for showing another exemplary embodiment of an AccuFET device of this invention. FIG. 7 shows an AccuFET device that is similar to the device shown in FIG. 2 except that the slots between the spacers 135 are now covered with Schottky barrier metal layer 145' to function as Schottky slot with no diffusion in contact. There are no P-dopants in the slot regions. The barrier metal functions as the P-Schottky shielded by the gate trenches. The Schottky barrier metal can comprise of an Schottky metal such as titanium, cobalt, nickel, aluminum, tantalum, or platinum. This is an embodiment with structural features having a direct metal contact to N-type silicon Schottky contact slot region. The Schottky contact slot region ensures an adequate threshold voltage because a depletion layer is formed. The Schottky contact slot regions further ensure the reduced conduction losses in some applications such as DC-to-DC power conversion, as discussed earlier.

Figure 8A:
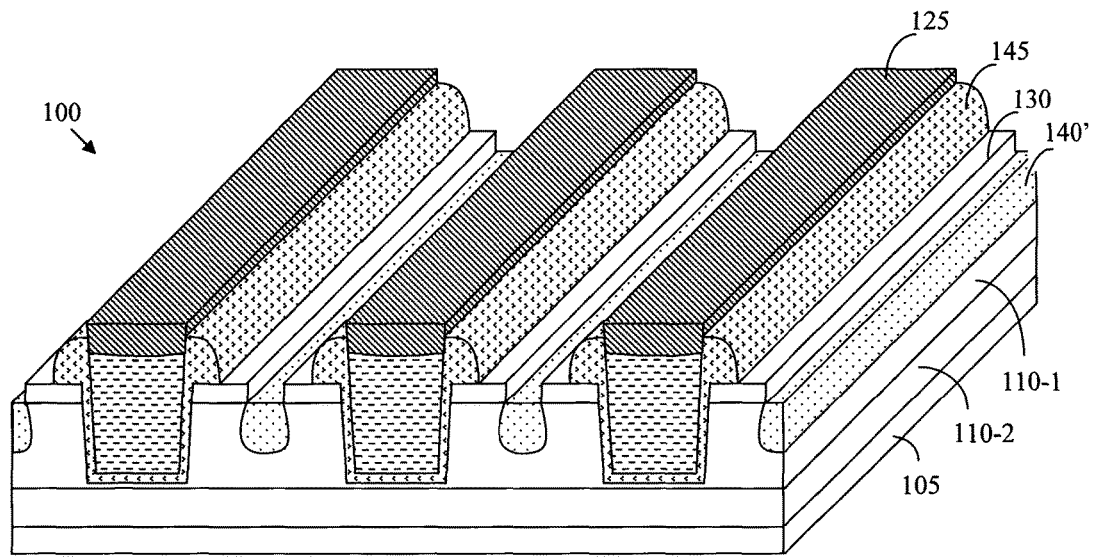
FIGS. 8A and 8B are perspective views of the AccuFET device configured with transistors of stripe cells and closed cells.
Figure 8B:
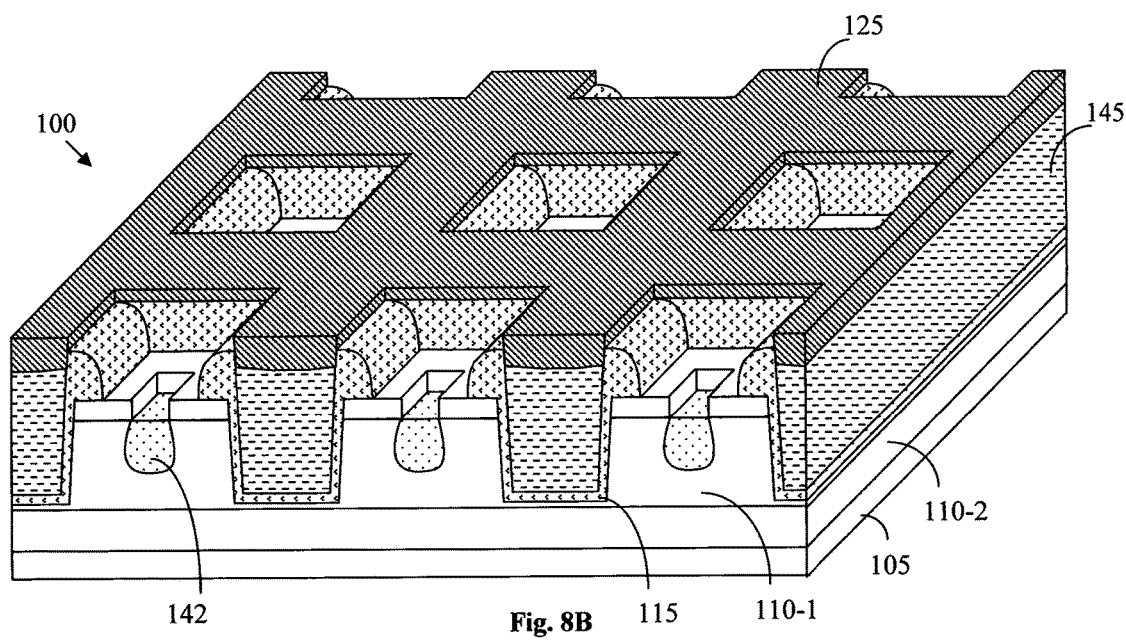

The AccuFET device as disclosed above can be configured either as stripe cells or closed cells as shown in FIGS. 8A and 8B respectively. The closed cell configuration shown in FIG. 8B has the advantage of providing enhanced pinch off as the slot region is completely surrounded by the trenched gate on four sides while in stripe cell configuration the slot region is only surrounded by the trenched gate on two sides.

Figure 9:
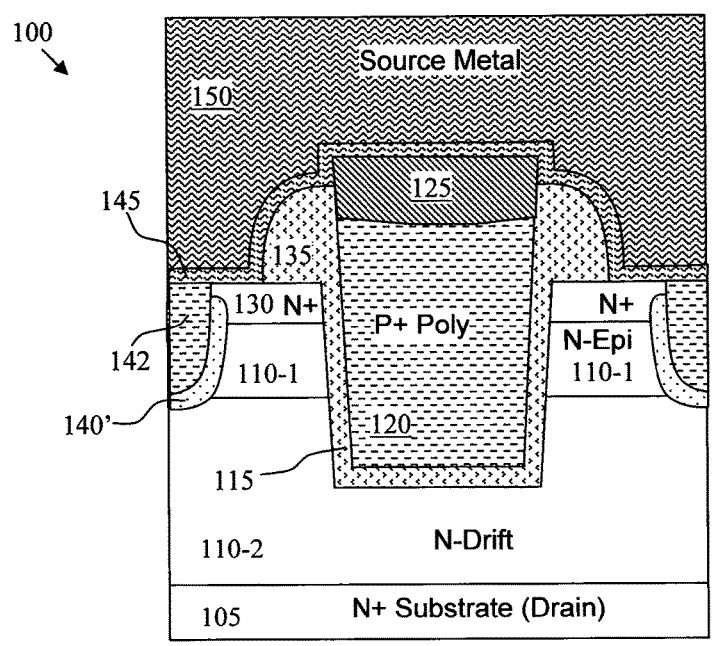
FIG. 9 is a cross sectional view of another AccuFET device formed on a substrate with particular epitaxial layer structure to improve pinch-off performance.

FIG. 9 is a cross sectional view to show an AccuFET device of this invention that has an epitaxial structure for incorporating a top surface layer with a thickness deeper than the highly doped source contact diffusion. The epitaxial layer 110-1 is deeper than the source contact areas 130, but shallower than the trenched gate 120 and has a relatively lower dopant concentration than the N-drift region 110-2, e.g., 1E15/cm$^3$. The device configuration as shown is useful to improve pinch-off while not increasing the Rdson resistance by much.

Figure 10A:
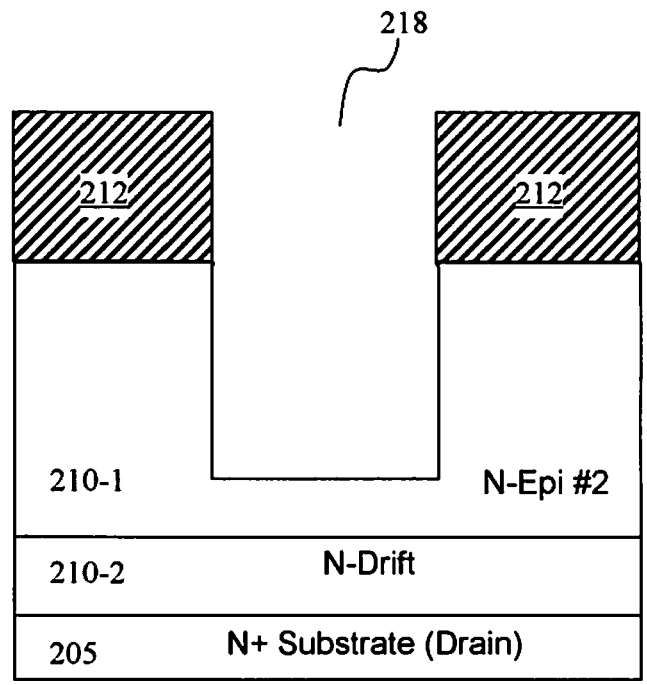
FIGS. 10A to 10K are a series of cross sectional views to illustrate processing steps of this invention to manufacture the AccuFET power device of FIG. 2.
Figure 10B:
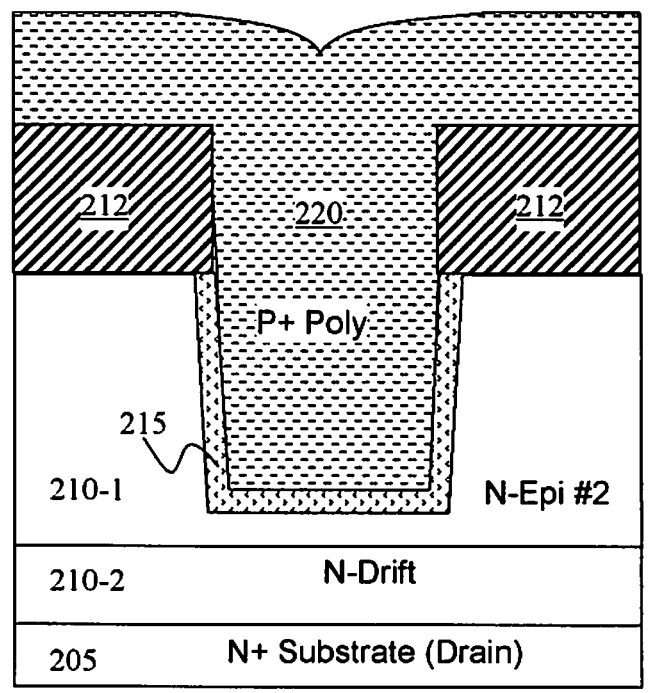
Figure 10C:
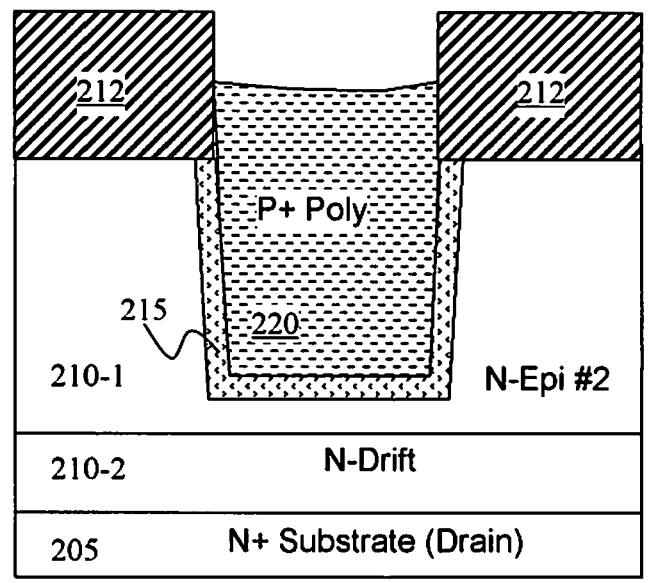

Referring to FIGS. 10A to 10M for a series of side cross sectional views to illustrate the fabrication steps of a semiconductor power device implemented as a self-aligned accumulation-mode field effect transistor (ACCUFET) device as shown in FIG. 2. FIG. 10A shows a starting silicon substrate 205 supports a lower-doped top channel epitaxial layer 210-1 slightly thicker than the depth of trenches and a higher doped drift region 210-2. The manufacturing processes proceed with the formation of a hard-mask oxide layer 212 by a local thermal oxidation (LTO) deposition or a thermal growth process. A trench mask (not shown) is applied to first etch the hard-mask oxide layer 212 followed by a silicon etch to open trenches 218 in the epitaxial layer 210-1. The process proceeds with a step of polymer strip to remove the chemical residues on trench sidewall resulting from trench etching. A round hole etch process is carried out as an optional step to smooth out the trenches in order to minimize stress and improve step coverage of subsequent processing. In FIG. 10B, a sacrificial oxide layer is grown followed by a sacrificial oxide etch with controlled etch process to repair the damages caused by the trench etch process. Then a gate oxide layer 215 is grown followed by deposition of polysilicon 220 and doping of the polysilicon 220 with P+ dopant for depletion mode. In FIG. 10C, a polysilicon etch back process is carried out to etch the polysilicon layer 220 by controlling the etch-back such that the polysilicon layer 220 is removed to have height sticking out above the top surface of the substrate, but below the top of the hard mask layer 212; the height can be about half of the thickness of the oxide hard-mask layer 212 so that the polysilicon gates 220 extend above the top surface of the silicon substrate.

Figure 10D:
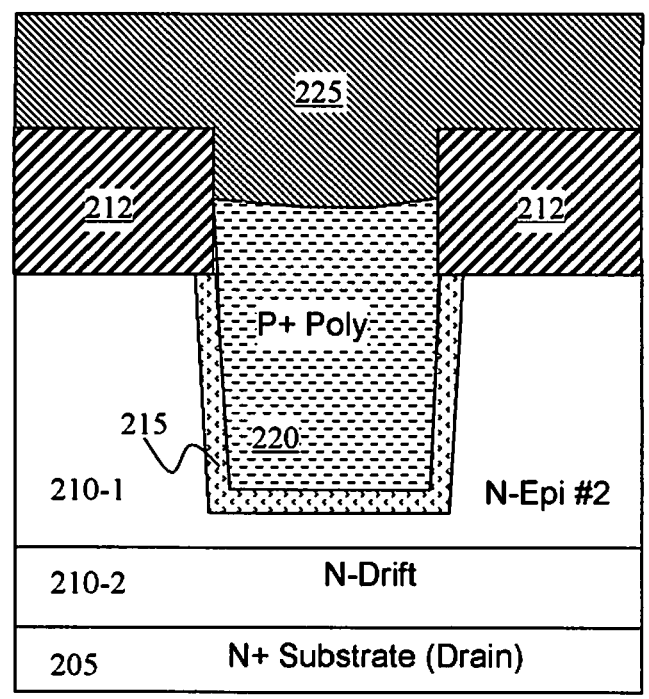
Figure 10E:
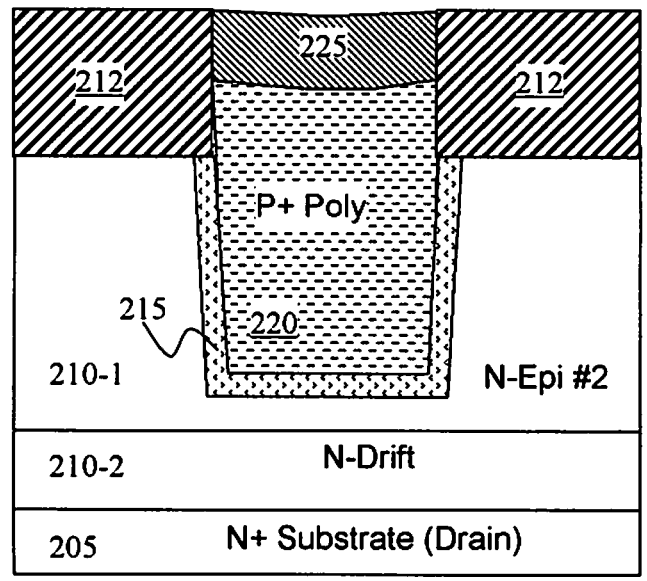
Figure 10F:
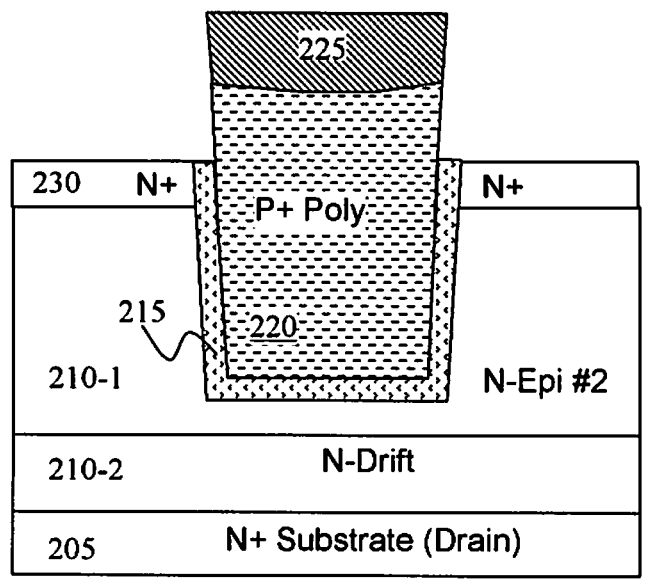
Figure 10G:
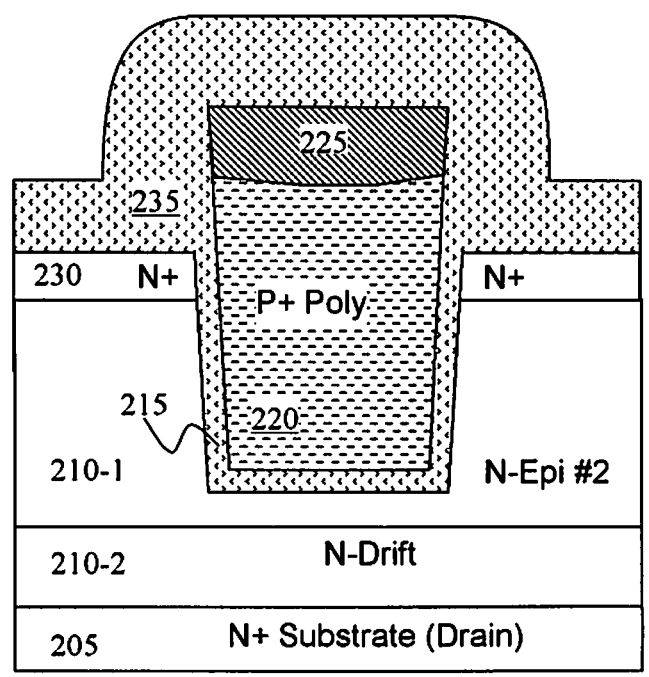
Figure 10H:
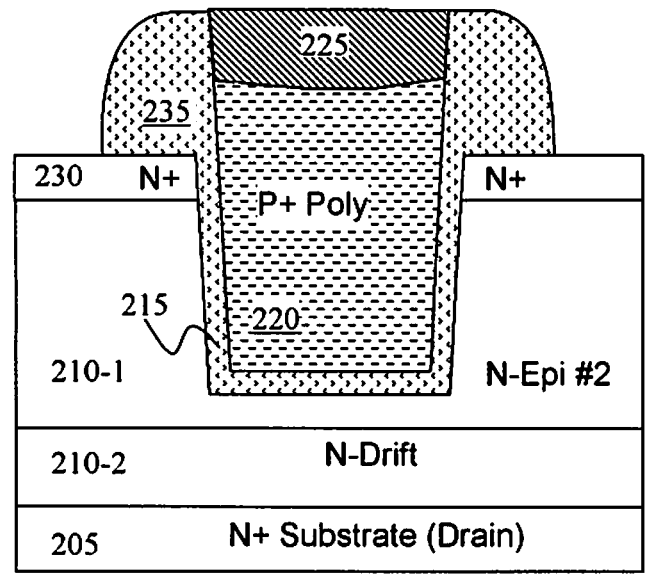
Figure 10I:
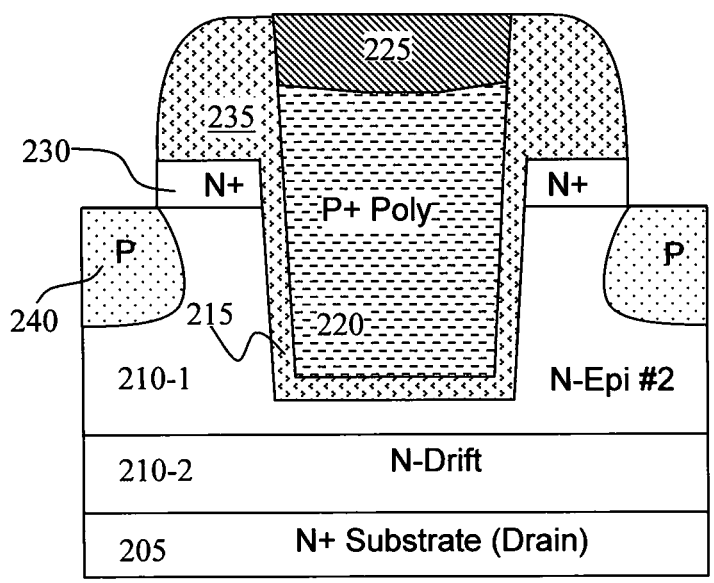

In FIG. 10D, a nitride layer 225 is deposited by applying a low-pressure vapor chemical deposition (LPCVD) or pressurized electrical chemical vapor deposition (PECVD) process. Then an optional etch-back mask (not shown) can be applied to etch back the nitride layer 225 while keeping portions of the nitride in the termination regions for specified applications. In FIG. 10E, the nitride layer 225 is selectively etched to have approximately same height as the hard oxide mask 212. Alternatively, the nitride layer 225 can be planarized with the hard mask 212 by chemical mechanical polishing (CMP). In FIG. 10F, the oxide hard mask 212 is stripped by applying a wet etch process. Then as an option, a source mask (not shown) is applied, to carry out a source implant. A blanket source implant can also be performed, without a mask, since the nitride cap 225 protects the polysilicon gate 220. Exemplary source implant process may include a step of perpendicular arsenic implant, i.e., zero tilt implant, with implant ion flux in a range between 2E15 to 7E15 and an implanting energy between 30 to 80 key to form the source regions 230. A source annealing process is carried out at 900 to 950 C. In FIG. 10G, a spacer oxide layer 235 is deposited with a thickness between 0.1 to 0.5 micrometers. In FIG. 10H, the spacer oxide layer 235 is anisotropically etched back to form oxide spacers 235 surrounding the polysilicon gate 220 and the nitride layer 225. In FIG. 10I, a selective silicon etch is performed by applying selective silicon etchant, e.g. sulfur hexafluoride (SF6), to remove the silicon layer heavily doped with source ions 230 from the top surface of the substrate around the spacers 235 surrounding the polysilicon gate 220 capped with a top nitride layer 225. A plurality of recess slots having a depth substantially the same thickness as the source regions 230, e.g., 0.1 to 0.4 micrometers, are therefore formed and the recessed slots are aligned with the spacers 235. A blanket implant with boron ions with an implant dose of 1E12 to 1E14 and implant energy between 10-100 Kev is carried out to form the P-doped slot regions 240 below the recessed slots.

Figure 10J:
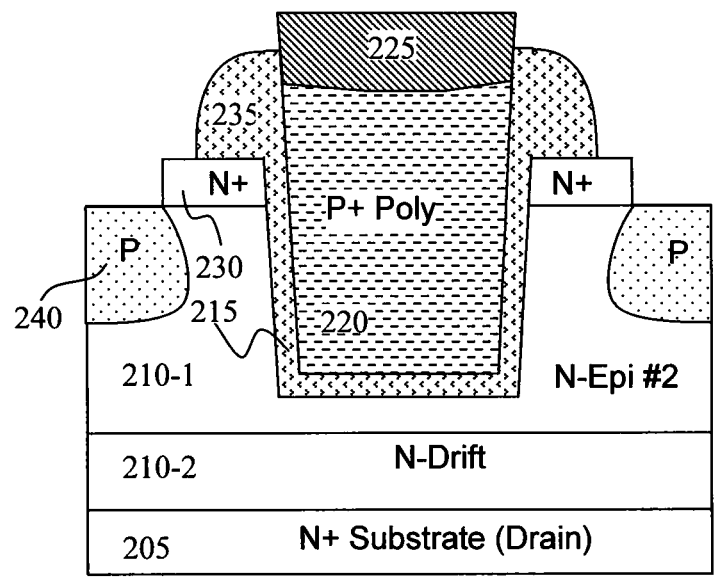
Figure 10K:
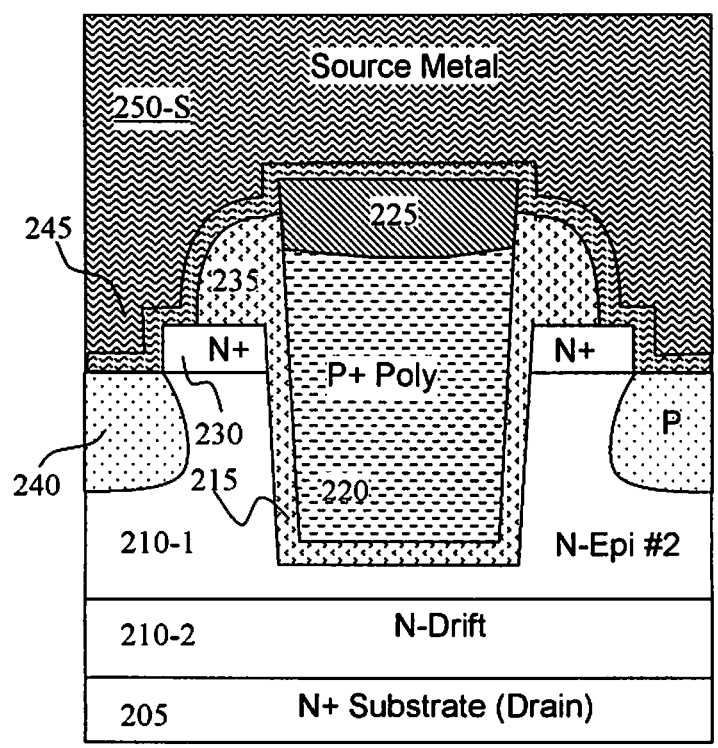

In FIG. 10J, a gate contact mask (not shown) is applied to etch gate contact openings (not specifically shown). Then a oxide isotropic etch back is performed, e.g. by wet buffer oxide etching (BOE), to reduce the thickness of the spacer layer 235 of a thickness reduction between 200 Angstroms to 2000 Angstroms to expose the top surface of the source regions 230. In FIG. 10K, a barrier metal layer 245 is deposited over the top surface to enhance the contact to the source and slot regions. Then a metal layer 250 is deposited over the top surface and patterned into source metal 250-S and gate pads (not shown). The manufacturing processes completed with the formation of the passivation layer and final alloy processes (not specifically shown).

Figure 11A:
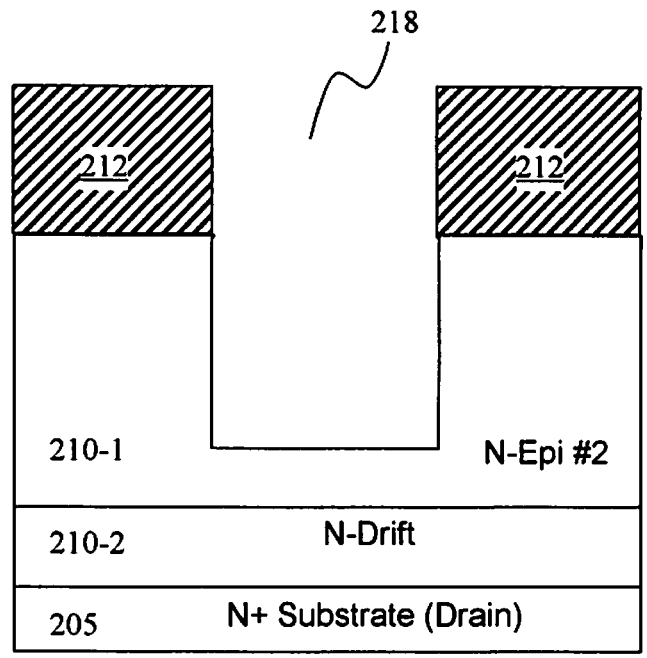
FIGS. 11A to 11M are a series of cross sectional views to illustrate processing steps of this invention to manufacture the AccuFET power device of FIG. 3.
Figure 11B:
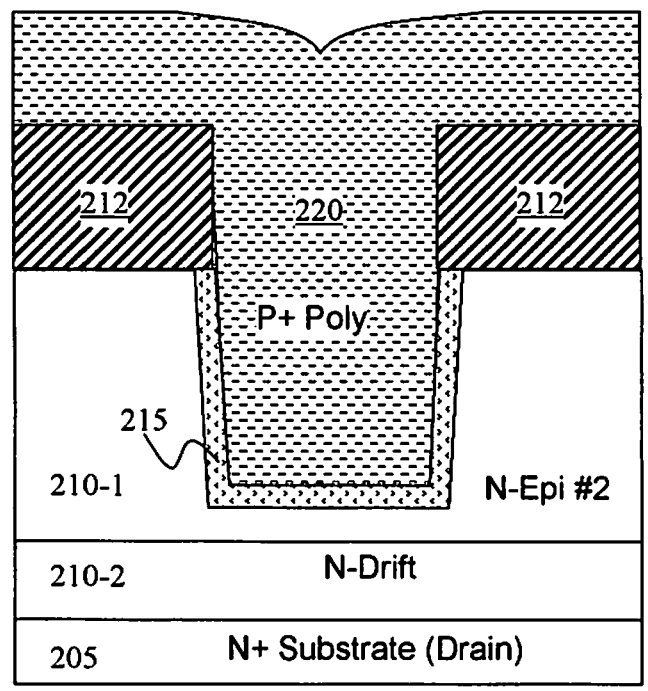
Figure 11C:
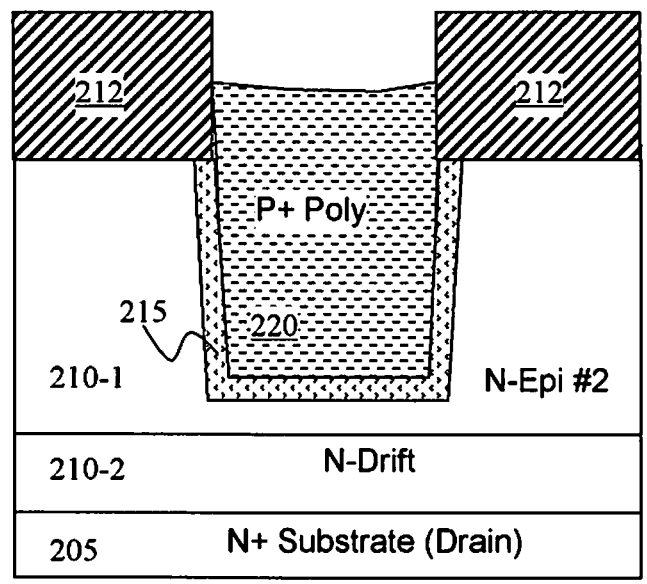
Figure 11D:
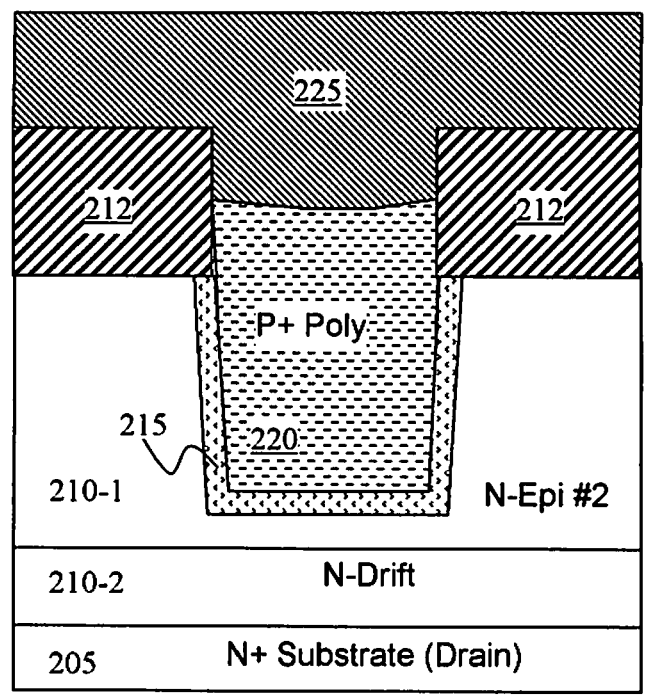
Figure 11E:
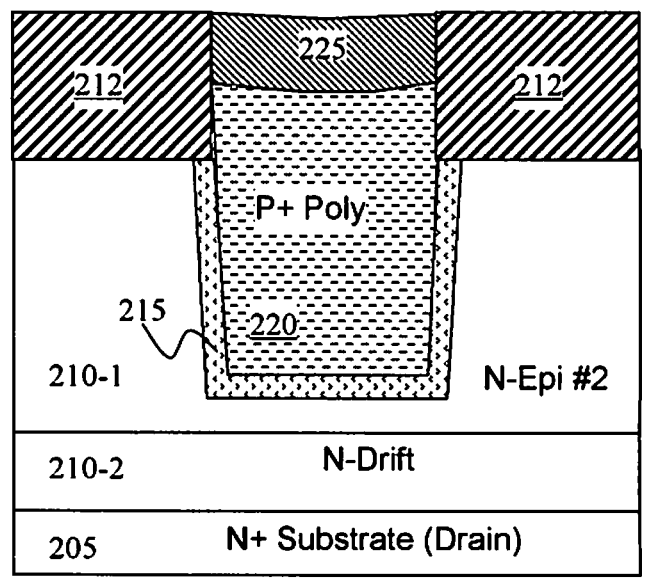
Figure 11F:
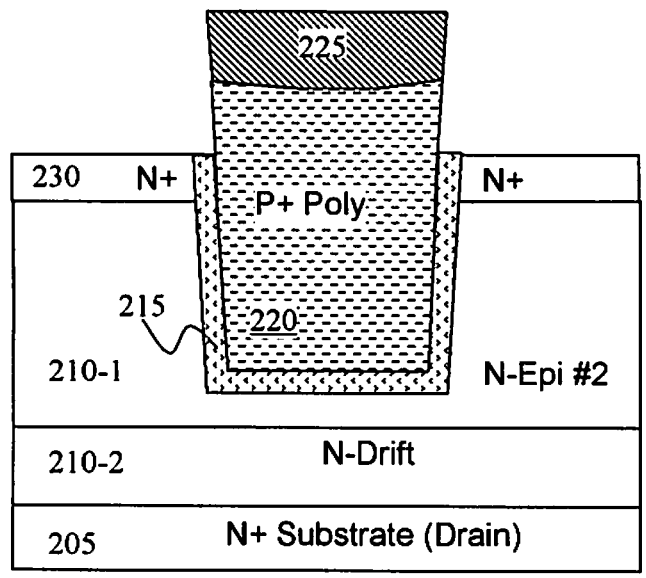
Figure 11G:
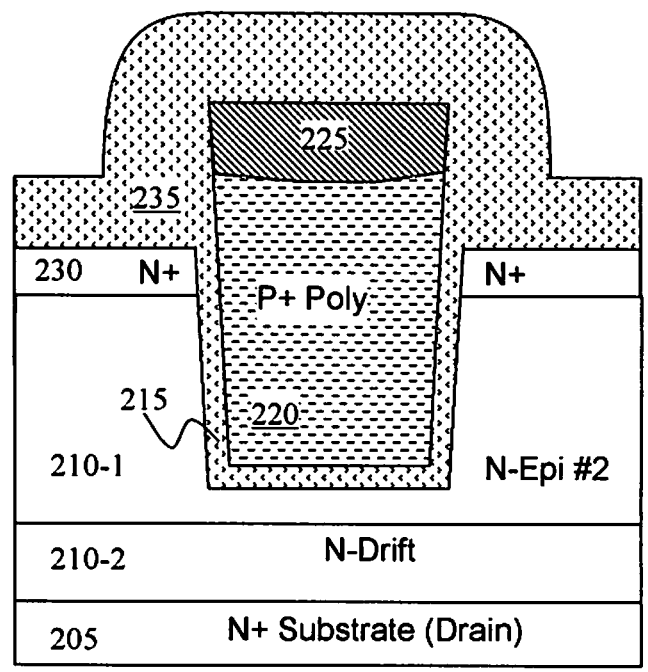
Figure 11H:
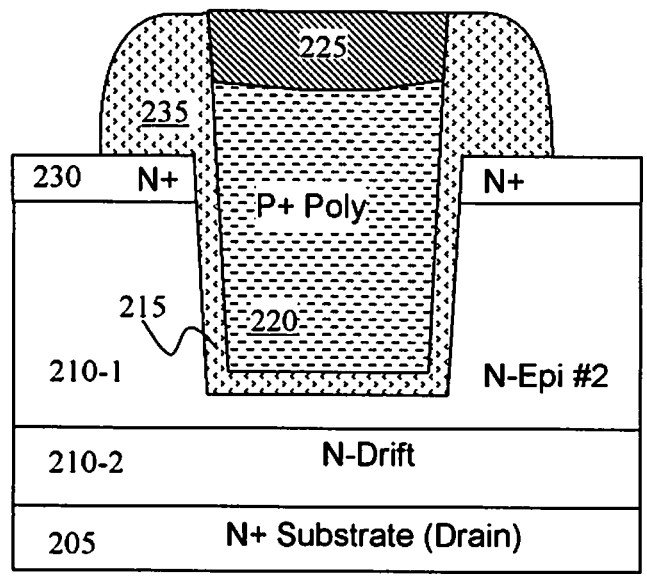
Figure 11I:
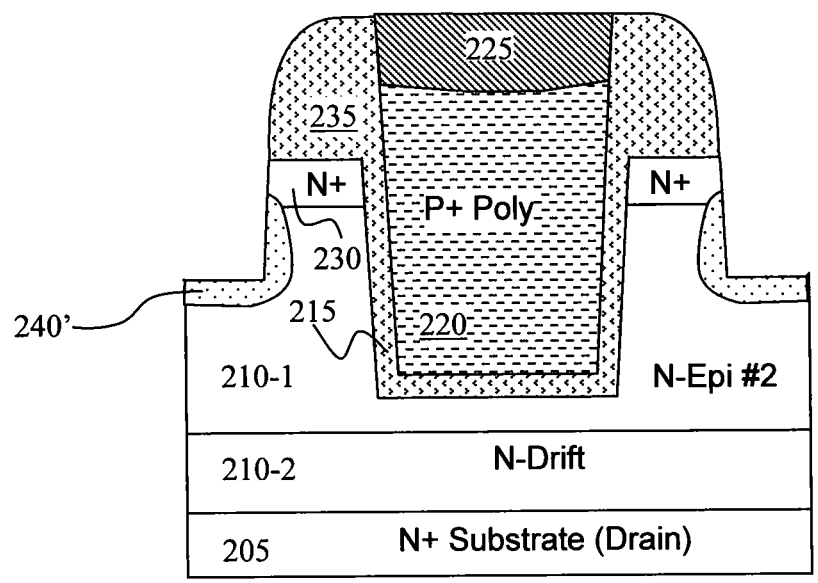
Figure 11J:
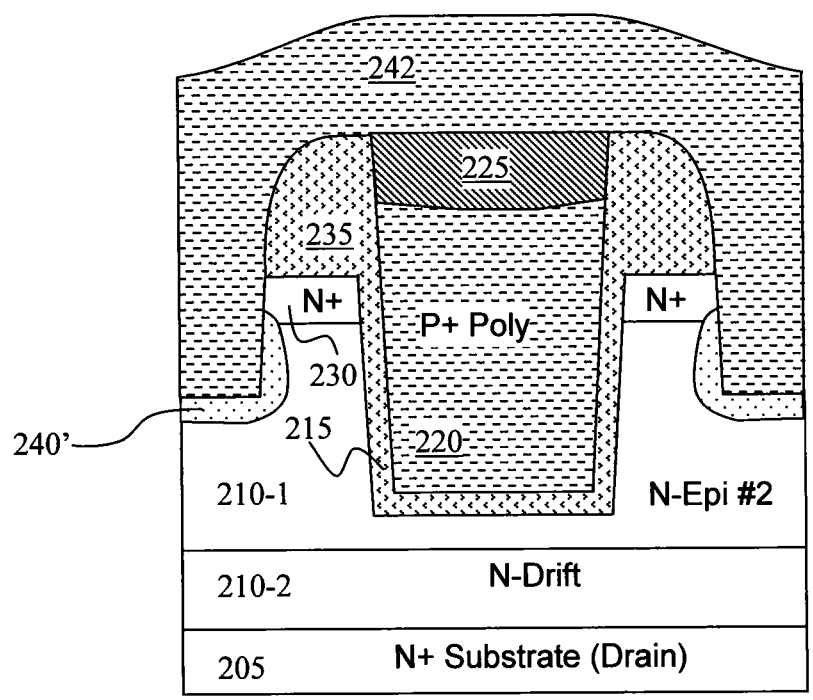
Figure 11K:
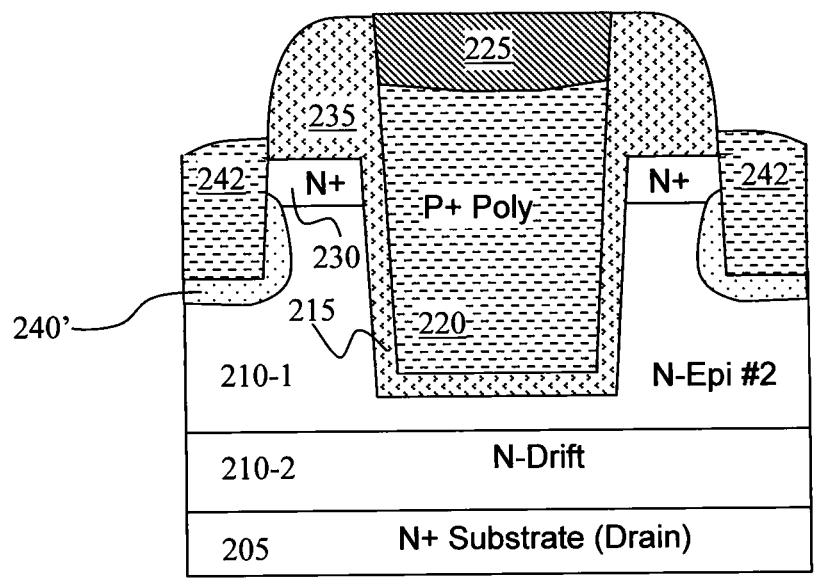
Figure 11L:
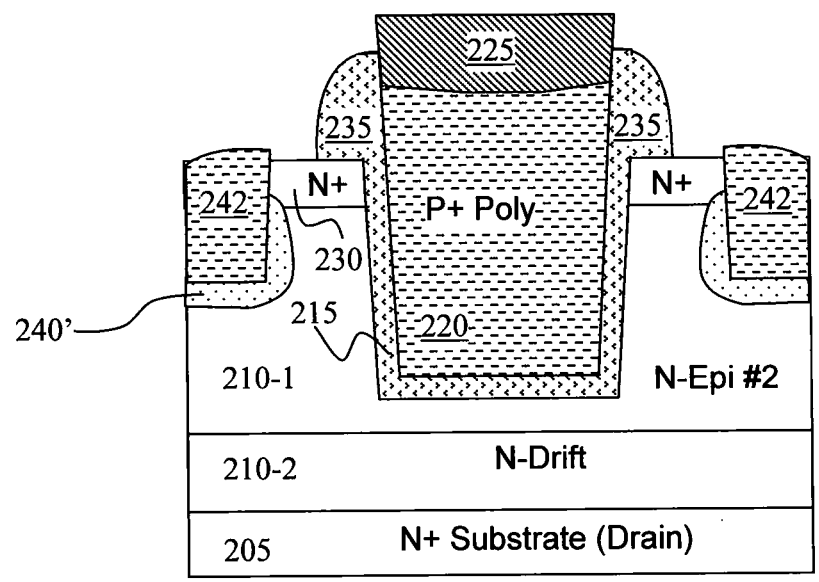
Figure 11M:
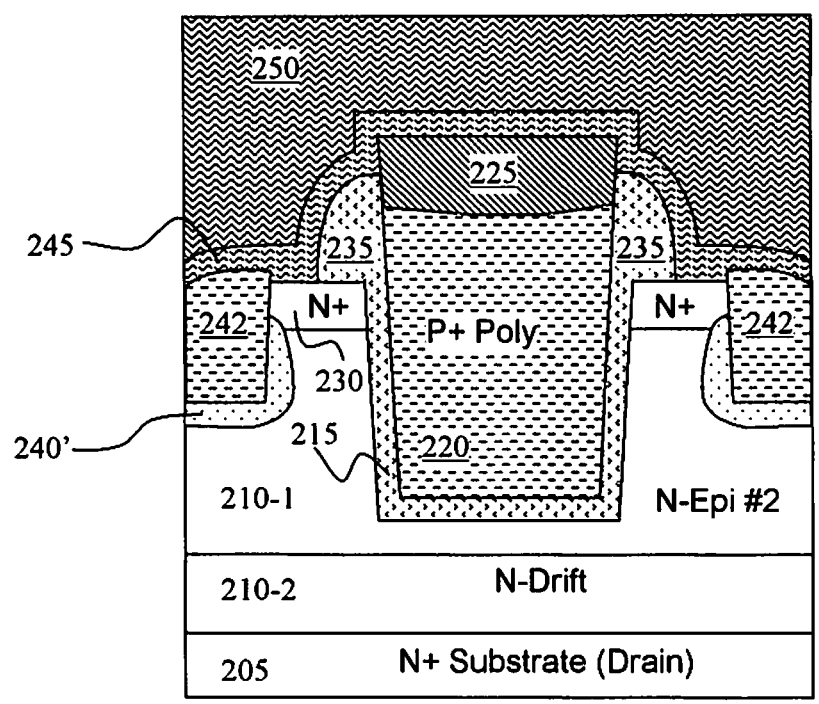

Referring to FIGS. 11A to 11M for a series of side cross sectional views to illustrate the fabrication steps to manufacture an alternate embodiment of an AccuFET device of this invention. The processing steps from FIGS. 11A to 11H are the same as that shown in FIGS. 10A to 10H. In FIG. 11I, shows a process of applying SF6 etchant for carrying out a selective silicon etch using the oxide spacers 235 and the nitride gate cap 225 as a mask. The etch depth can be about two to three times the depth of the source regions 230 that is approximately 0.4 to 0.8 microns for a device with pitch equal or less than one micrometer. A tilted boron implant is carried out with an implanting dose of 1E12 to 1E14 at an energy between 10 to 100 Kev, preferably 5E12 at 10 Kev, having a tilt angle of +/− seven degrees with rotation operation to implant the P-slot region 240' along the sidewalls of the slots etched between the spacers 235. An optional process may be carried out to form a shallow trench bottom boron implant region. Alternatively, the P-slot regions 240' can be formed by diffusing P-dopant from the polysilicon layer 242 deposited in FIG. 11J. In FIG. 11J, a polysilicon layer 242 having a thickness of about 0.1 to 0.4 microns is deposited. The polysilicon layer 242 may be doped with boron ions at a dose of 1E15 with implanting energy of 10-60 Kev. The polysilicon may also be doped with a in-situ boron doping process. A rapid thermal process (RTP) or diffusion may be carried out at 900 degrees Celsius for one minute for annealing the device. In FIG. 11K, a polysilicon etch back process is carried out to etch the polysilicon layer 242 from the top surface while leaving the oxide and the nitride cap 225 intact. The polysilicon layer 242 can be etched back to planarize it with the source regions 230. In FIG. 11L, a oxide selective etch back is performed, e.g., by wet BOE, to reduce the thickness of the spacer layer 235 of a thickness reduction between 200 Angstroms to 2000 Angstroms to expose the top surface of the source regions 230. In FIG. 11M, a barrier metal layer 245 is deposited over the top surface to enhance the contact to the source and the slotted gate regions followed by an annealing process. Then a metal layer 250 is deposited over the top surface and patterned into source metal 250-S and gate pads (not shown). The manufacturing process is completed with the formation of the passivation layer and final alloy processes (not specifically shown).

Figure 12A:
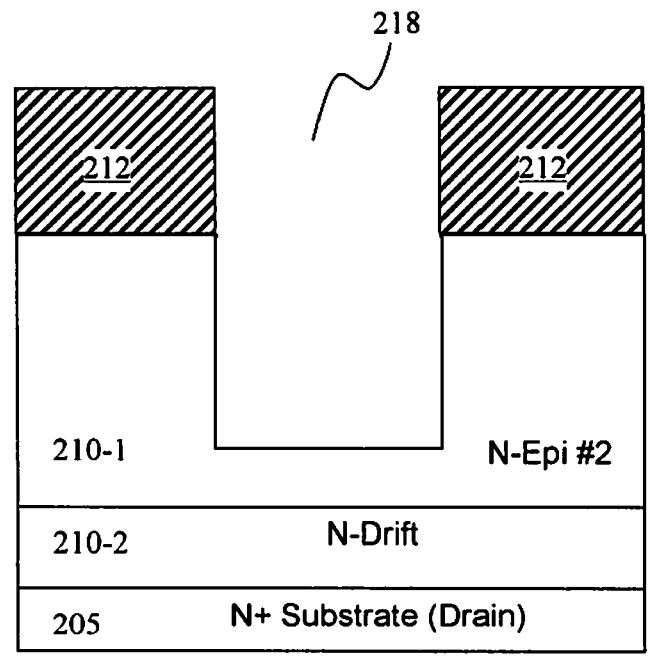
FIGS. 12A to 12K are a series of cross sectional views to illustrate processing steps of this invention to manufacture the AccuFET power device with slots filled with a barrier metal.
Figure 12B:
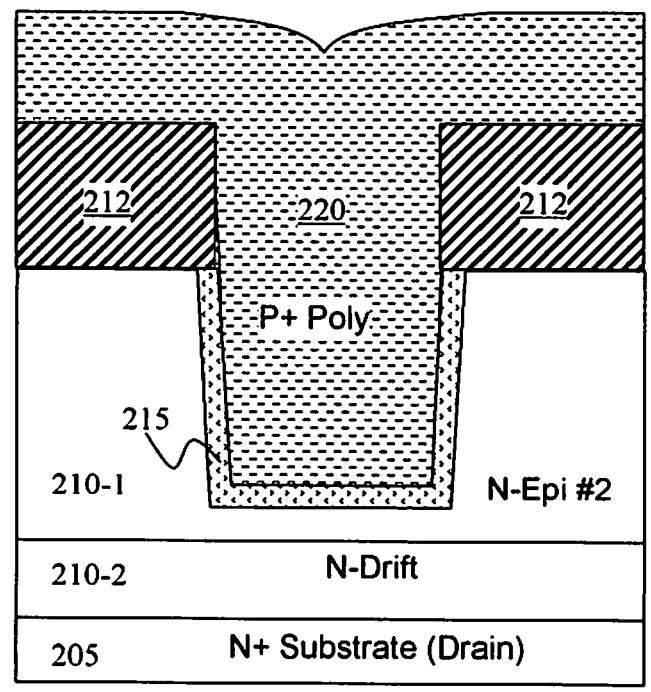
Figure 12C:
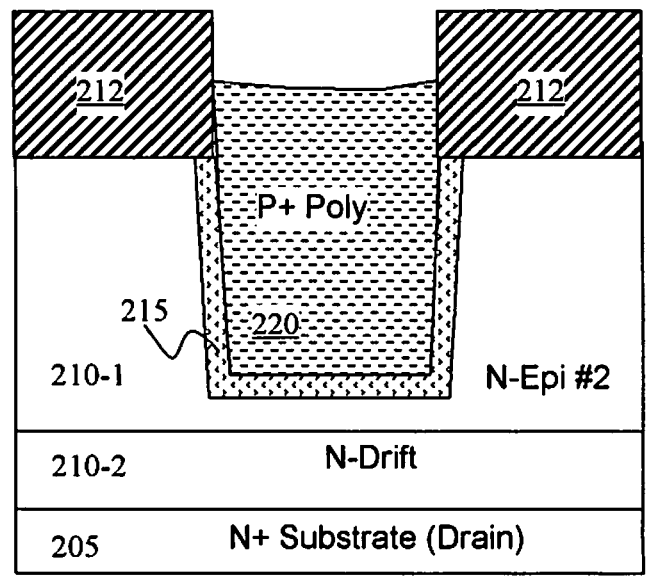
Figure 12D:
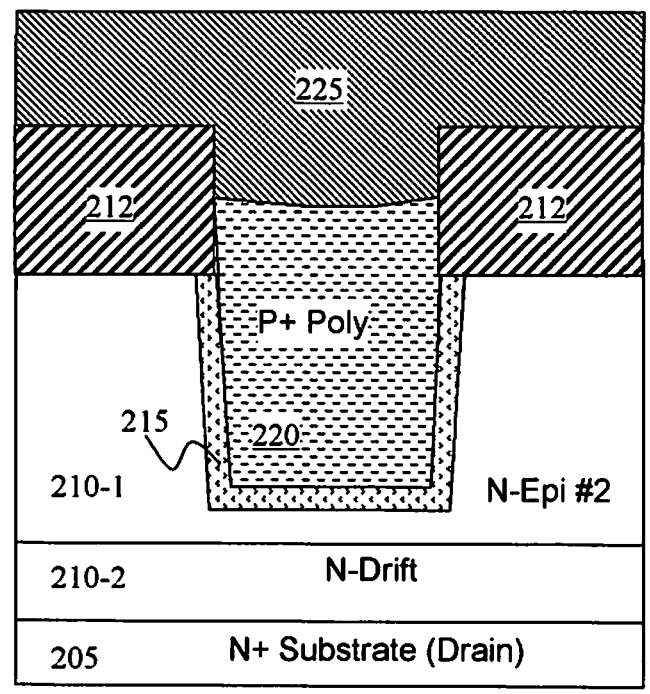
Figure 12E:
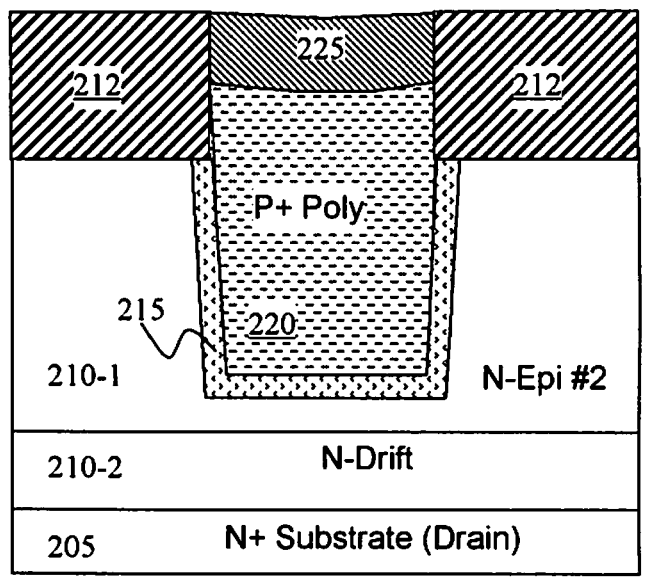
Figure 12F:
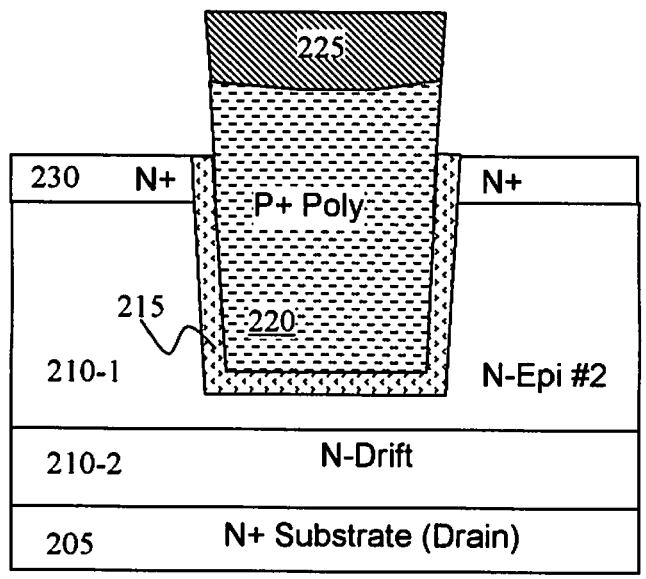
Figure 12G:
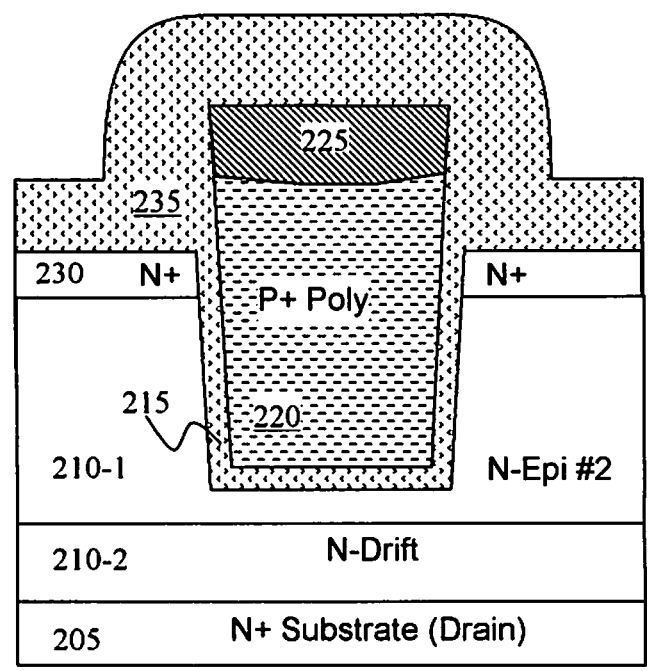
Figure 12H:
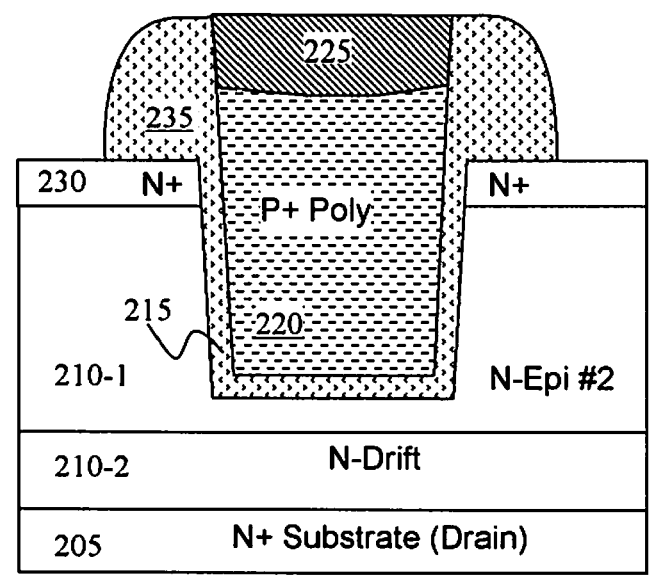
Figure 12I:
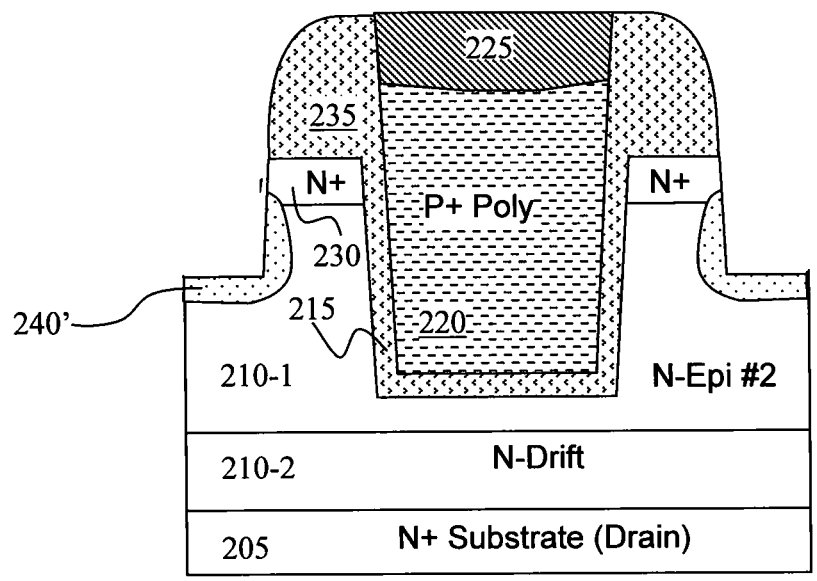
Figure 12J:
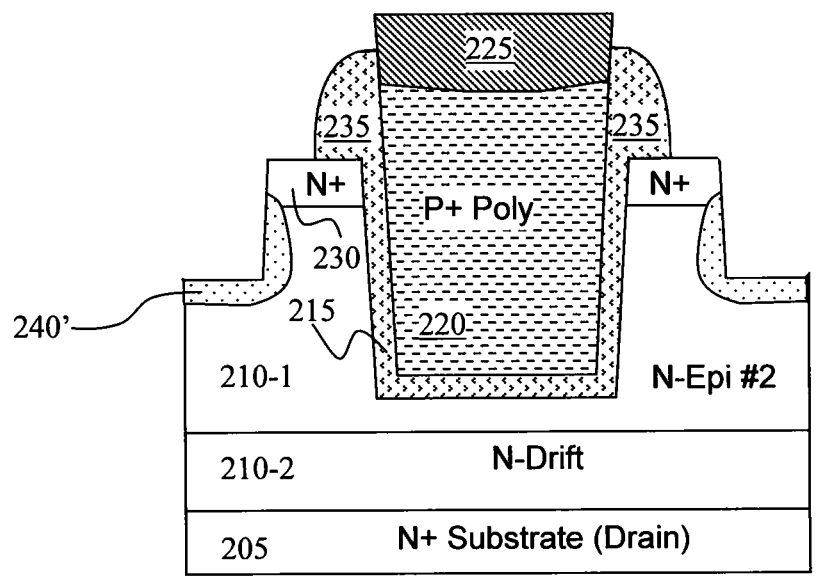
Figure 12K:
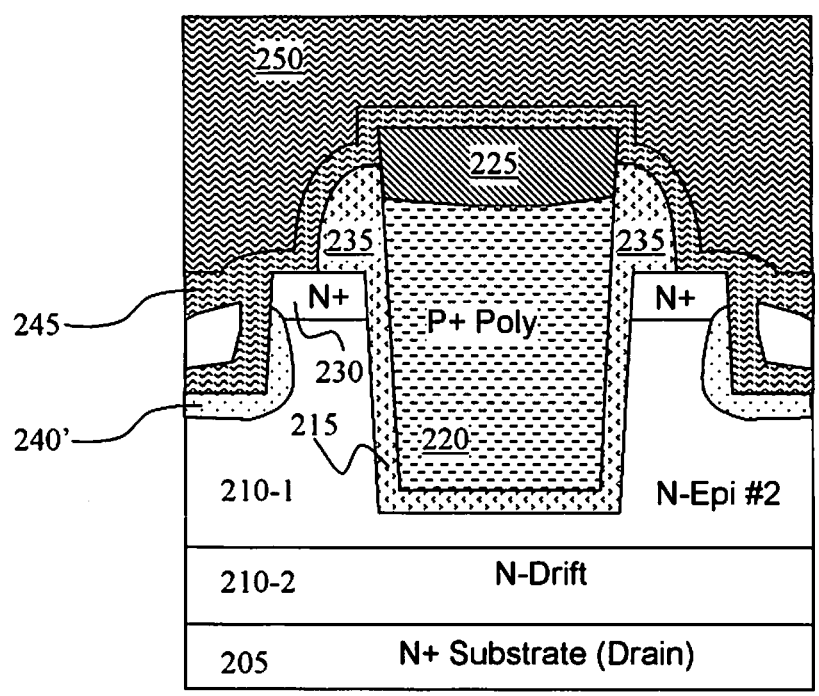

Referring to FIGS. 12A to 12M for a series of side cross sectional views to illustrate the fabrication steps to manufacture an alternate embodiment of an AccuFET device of this invention. The processing steps from FIGS. 12A to 12H are the same as that shown in FIGS. 10A to 10H. In FIG. 12I, shows a process of applying SF6 etchant for carrying out selective silicon etch leaving only the oxide spacers 235 and the nitride gate cap 225. The etch depth is about two to three times the depth of the source regions 230 that is approximately 0.4 to 0.8 microns for a device with pitch equal or less than one micrometer. A tilt boron implant is carried out with an implanting dose of 1E12 to 1E14 at an energy between 10 to 100 Kev, preferably 5E12 at 10 Kev, having a tilt angle of +/−seven degrees with rotation operation to implant the P-slot region 240' along the sidewalls of the slots etched between the spacers 235. An optional process may be carried out to form a shallow trench bottom boron implant region. In FIG. 12J, an oxide select etch back is performed, e.g., by wet BOE, to reduce the thickness of the spacer layer 235 of a thickness reduction between 200 Angstroms to 2000 Angstroms to expose the top surface of the source regions 230. In FIG. 12K, a barrier metal layer 245 is deposited over the top surface to enhance the contact to the source and the slotted gate regions and filling the slots between the sidewall spacers 235 followed by an annealing process. Then a metal layer 250 is deposited over the top surface and patterned into source metal 250-S and gate pads (not shown). The manufacturing processes completed with the formation of the passivation layer and final alloy processes (not specifically shown). The barrier metal layer 245 may be a Schottky barrier metal and a light shallow P-dopant region to provide a Shannon effect to adjust barrier height for reducing a leakage current may be implemented as well. U.S. patent application Ser. No. 11/890,851 discloses the application of Shannon implant for adjusting barrier height and is incorporated hereby for reference.

Figure 13A:
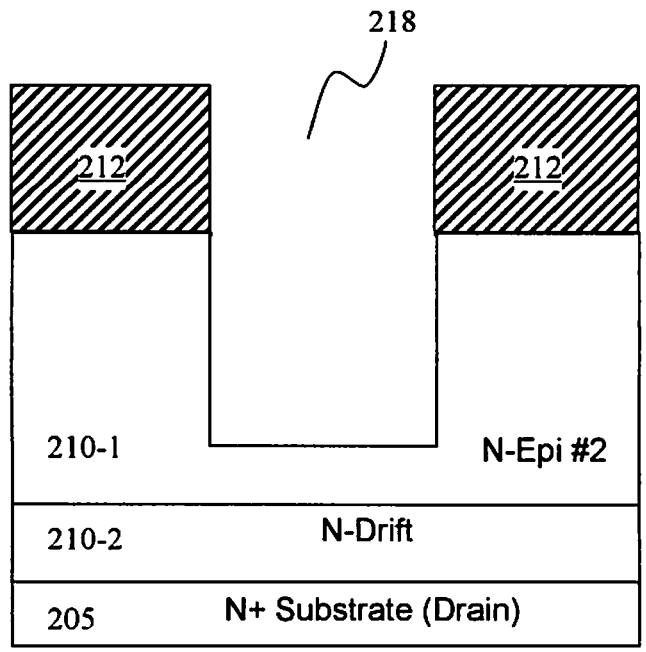
FIGS. 13A to 13M are a series of cross sectional views to illustrate processing steps of this invention to manufacture the AccuFET power device with slots filled with a polysilicon.
Figure 13B:
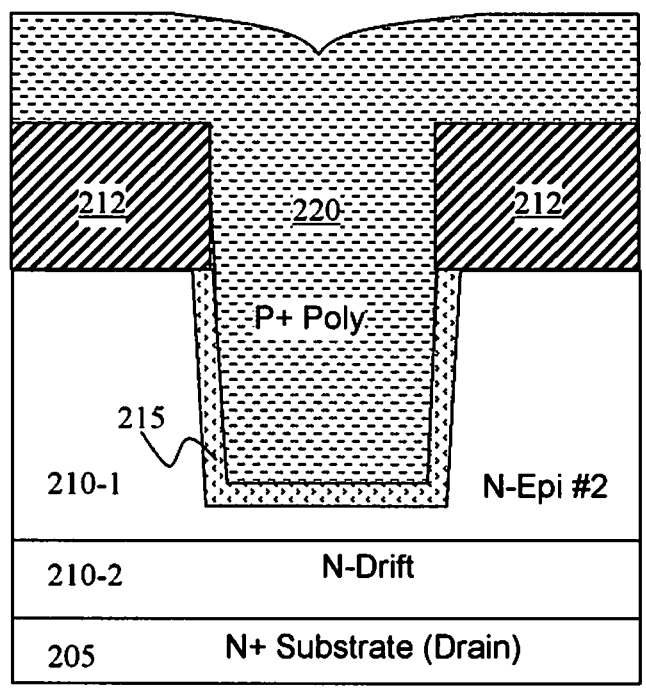
Figure 13C:
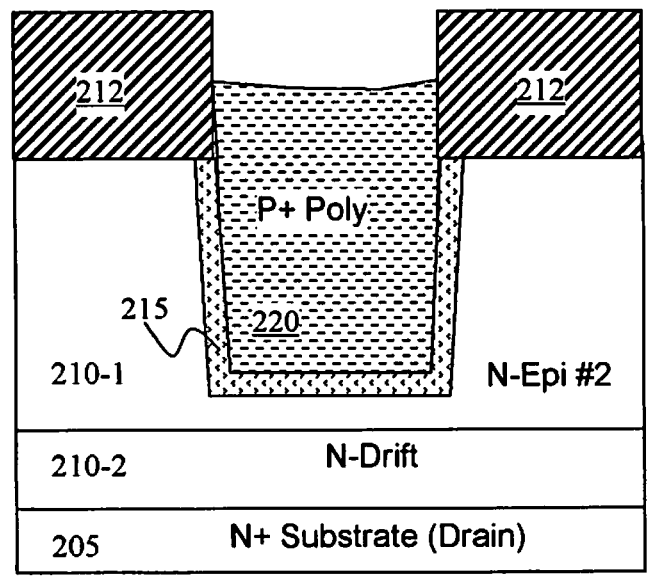
Figure 13D:
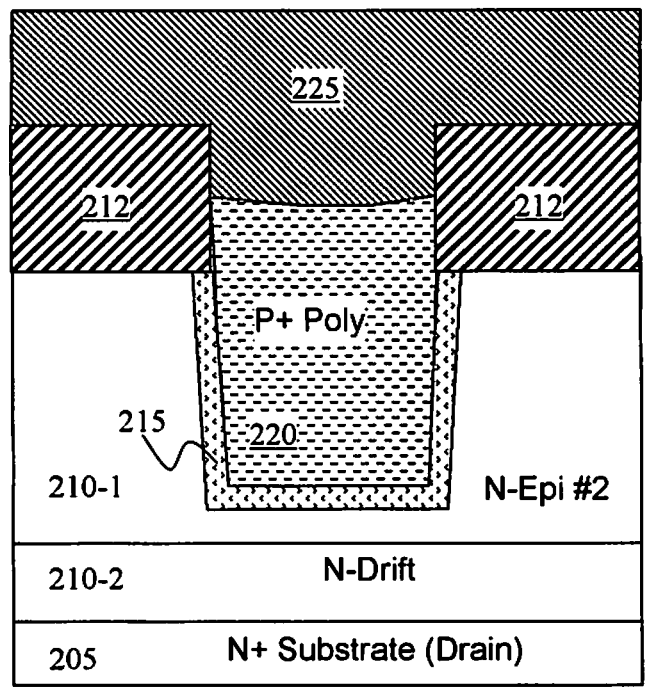
Figure 13E:
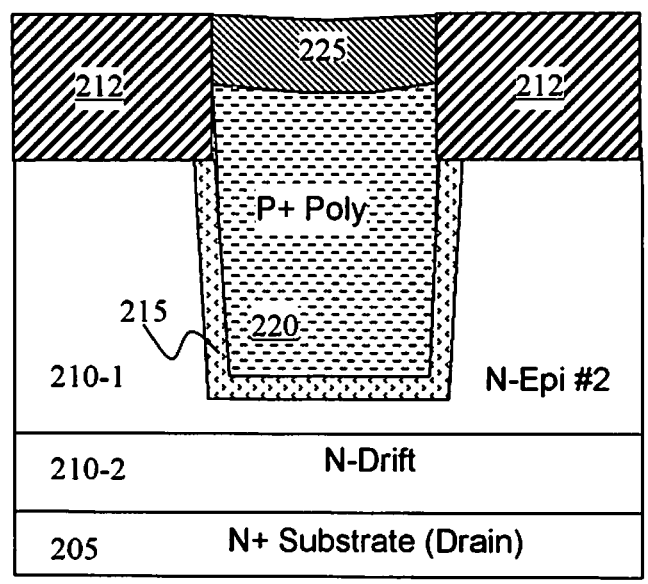
Figure 13F:
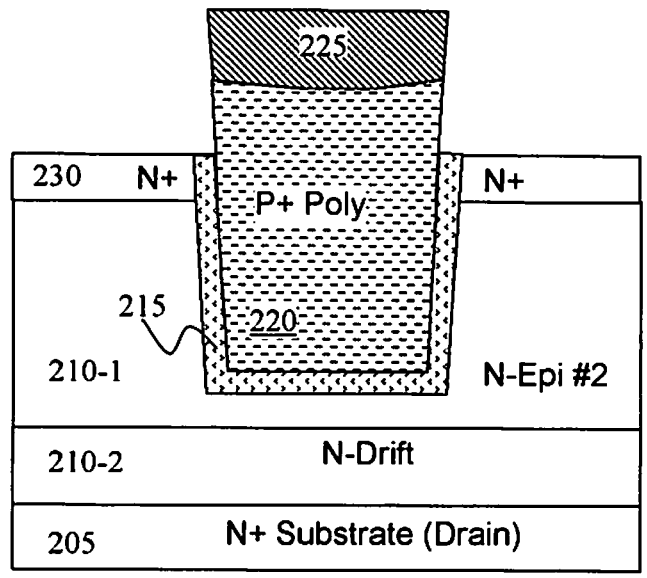
Figure 13G:
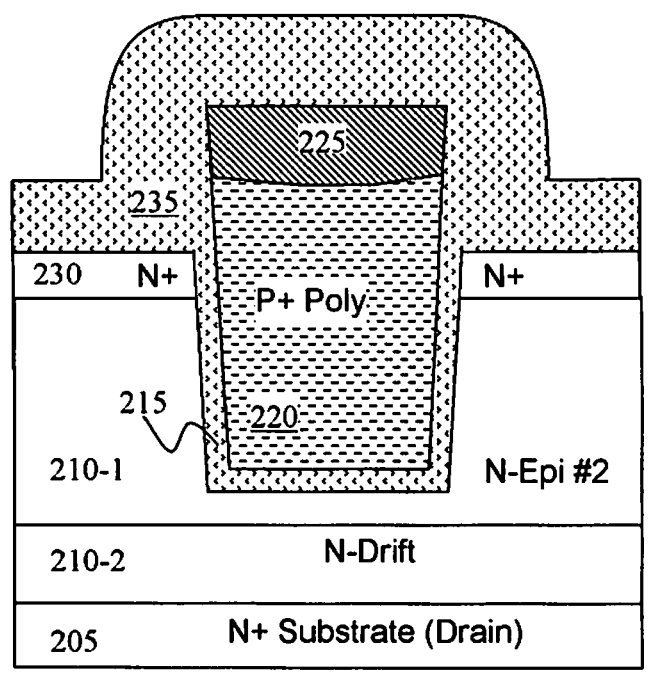
Figure 13H:
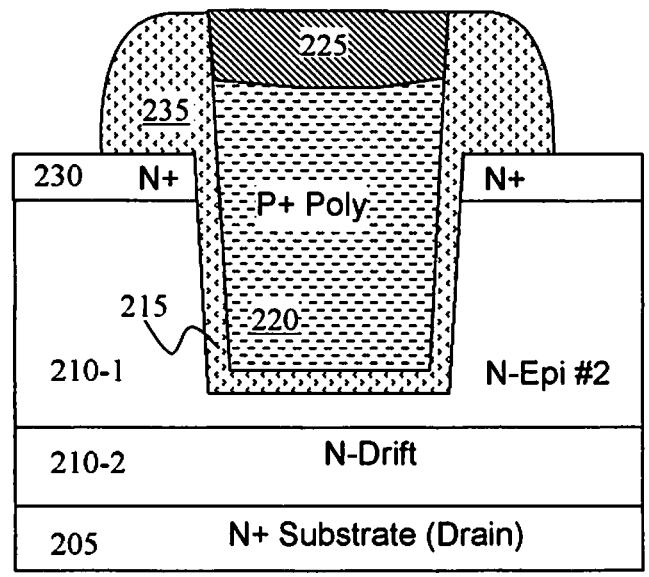
Figure 13I:
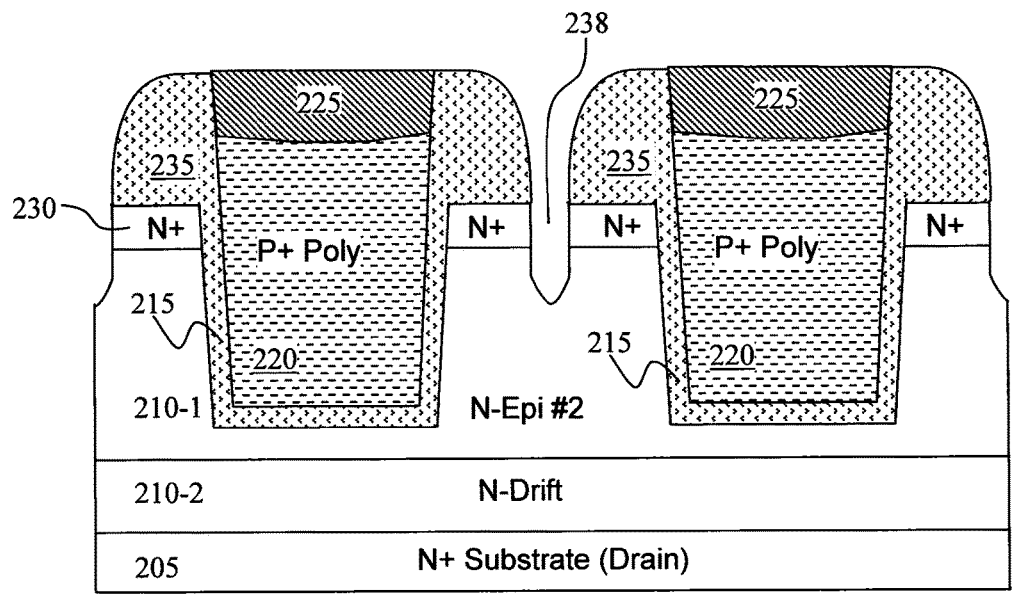
Figure 13J:
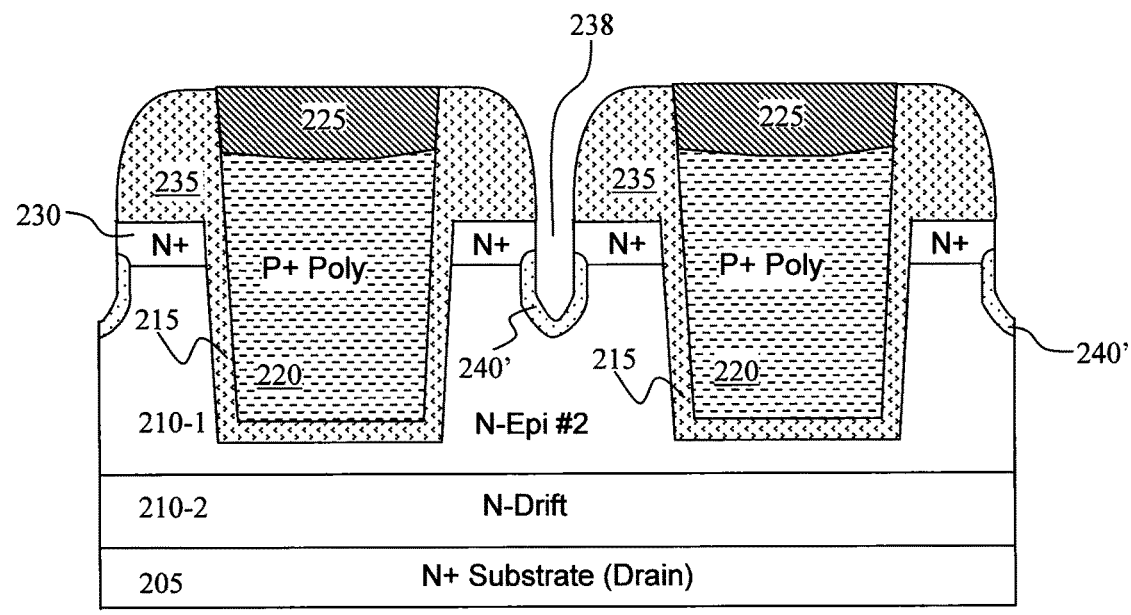
Figure 13K:
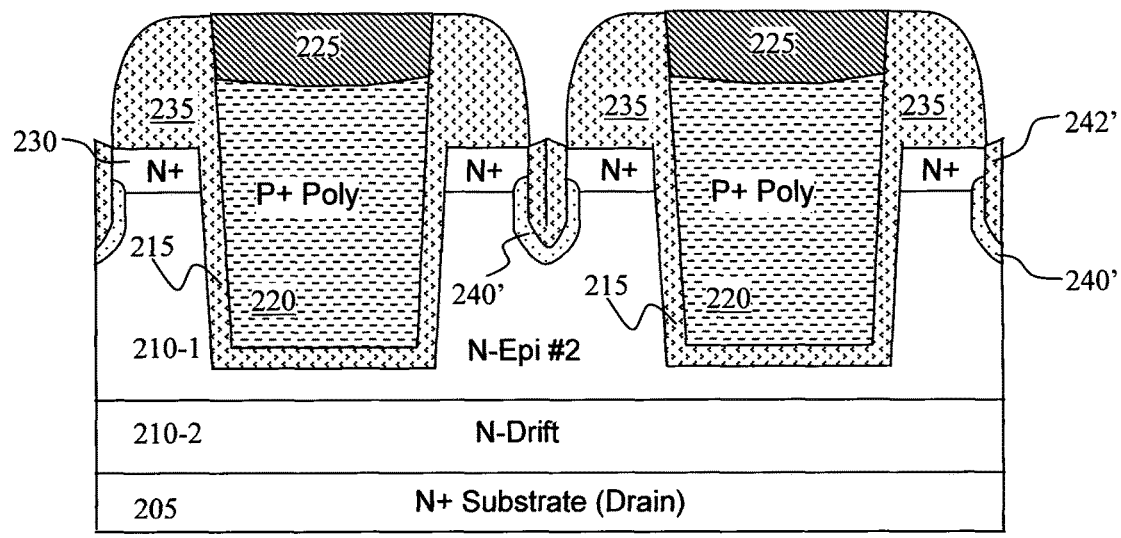
Figure 13L:
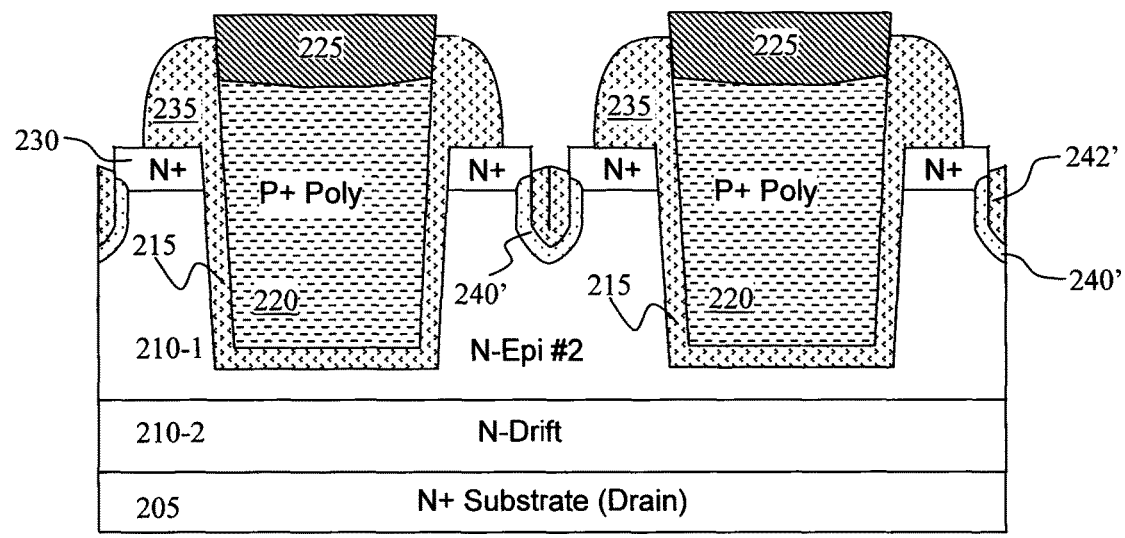
Figure 13M:
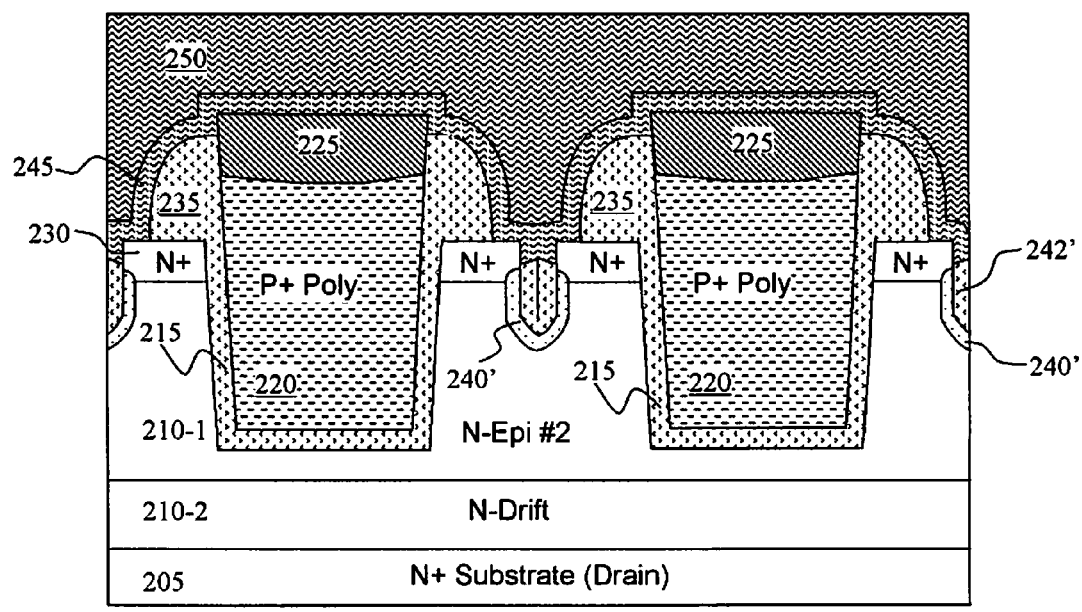
Figure 14A:
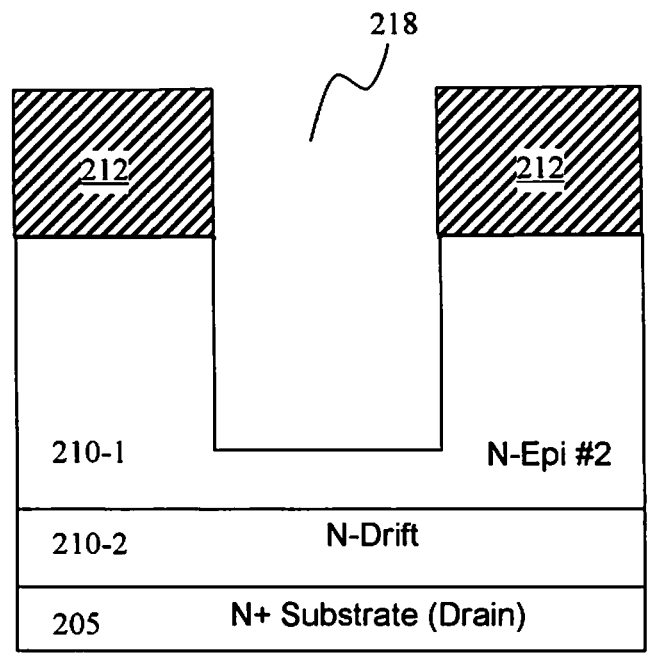
FIGS. 14A to 14L discloses a cross sectional view of device manufactured by the processing similar to that described in FIGS. 13A to 13M by skipping the boron implants and the optional anneal process in the slot-gate regions.
Figure 14B:
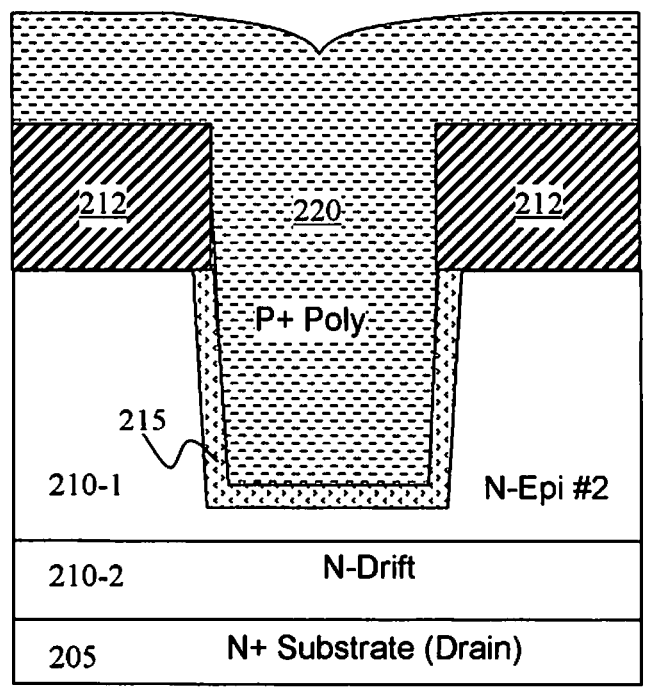
Figure 14C:
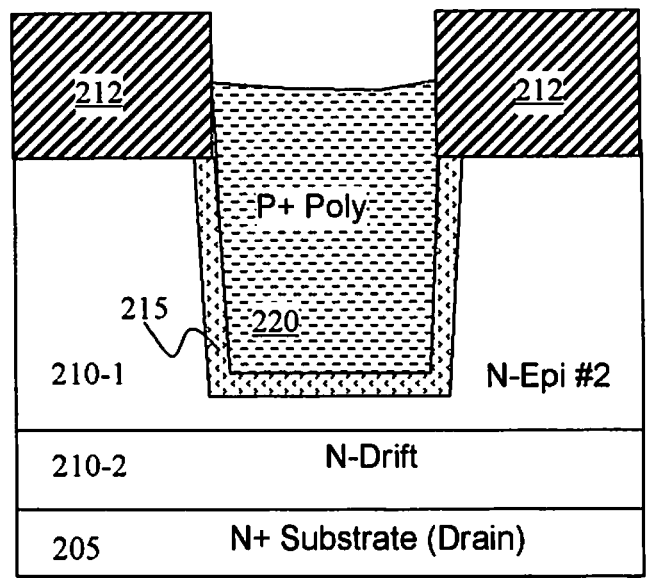
Figure 14D:
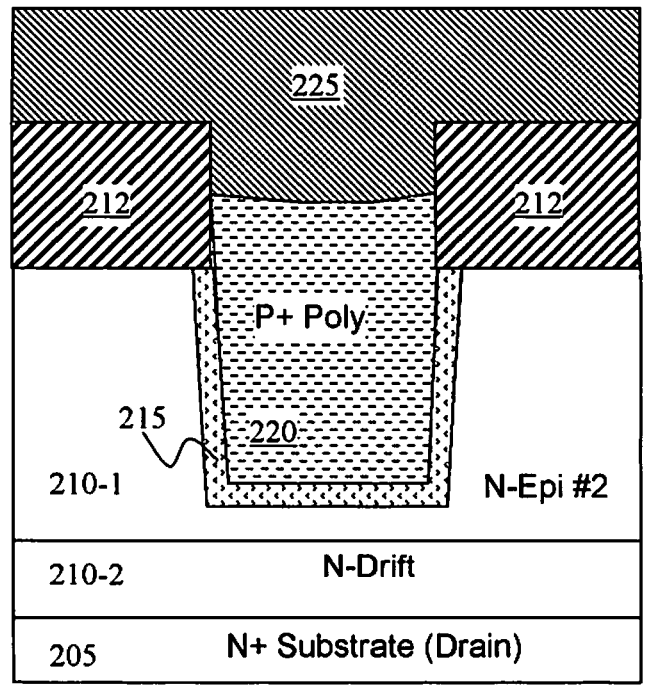
Figure 14E:
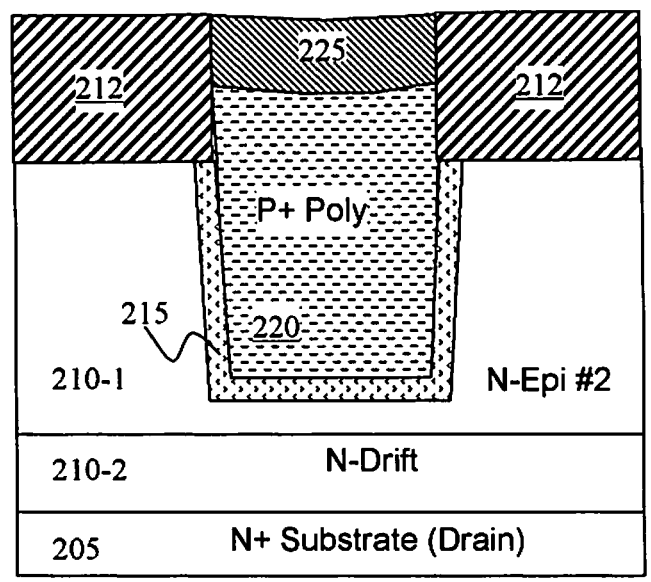
Figure 14F:
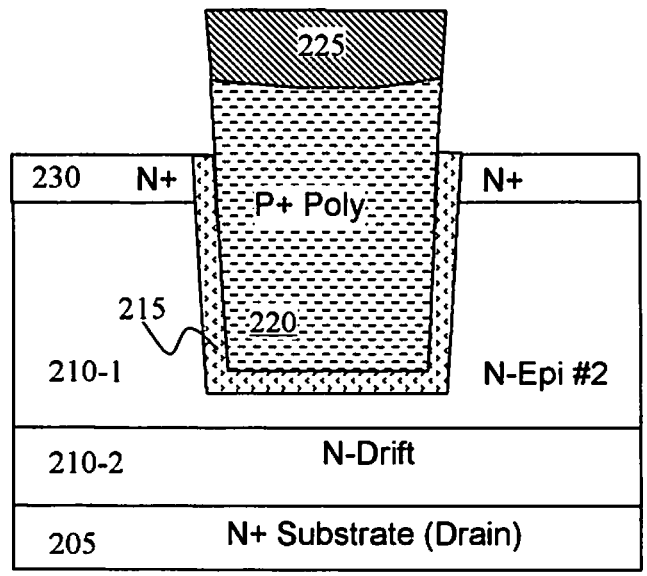
Figure 14G:
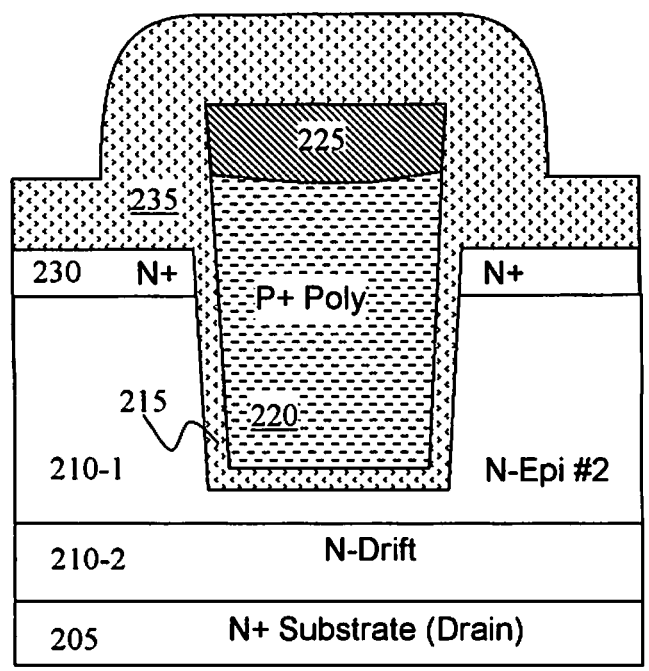
Figure 14H:
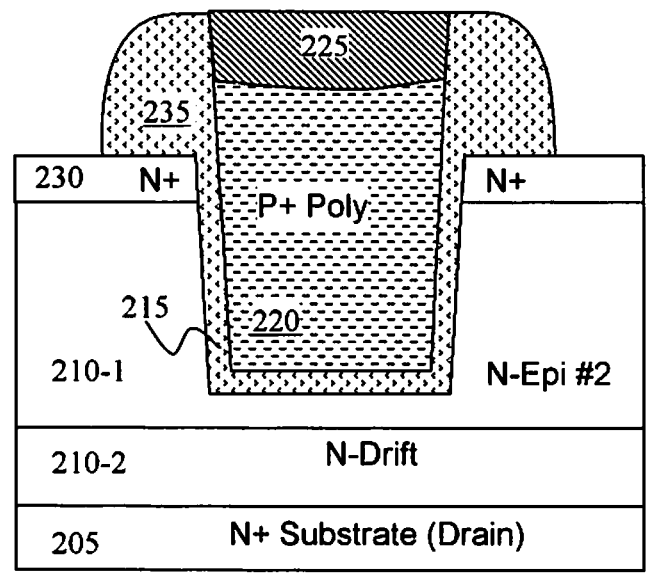
Figure 14I:
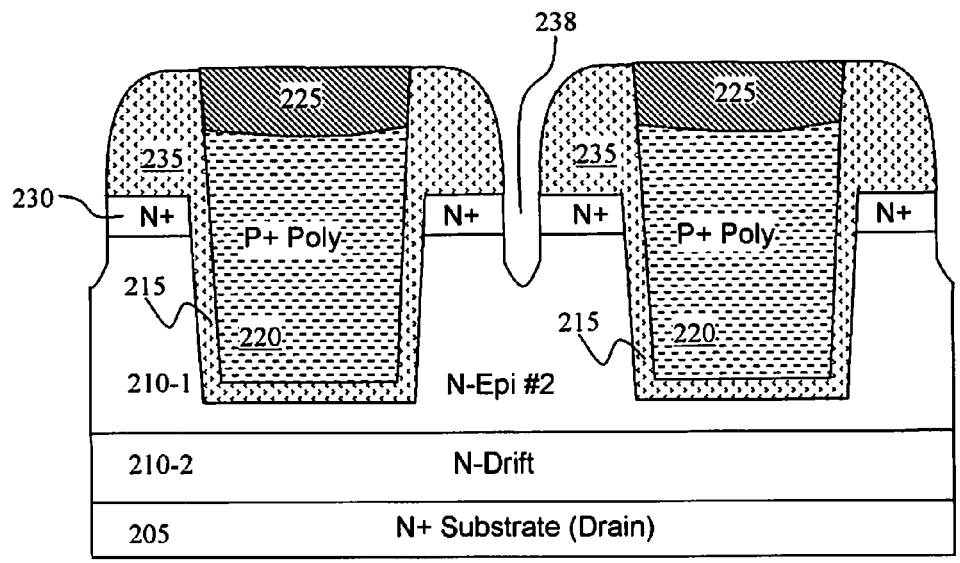
Figure 14J:
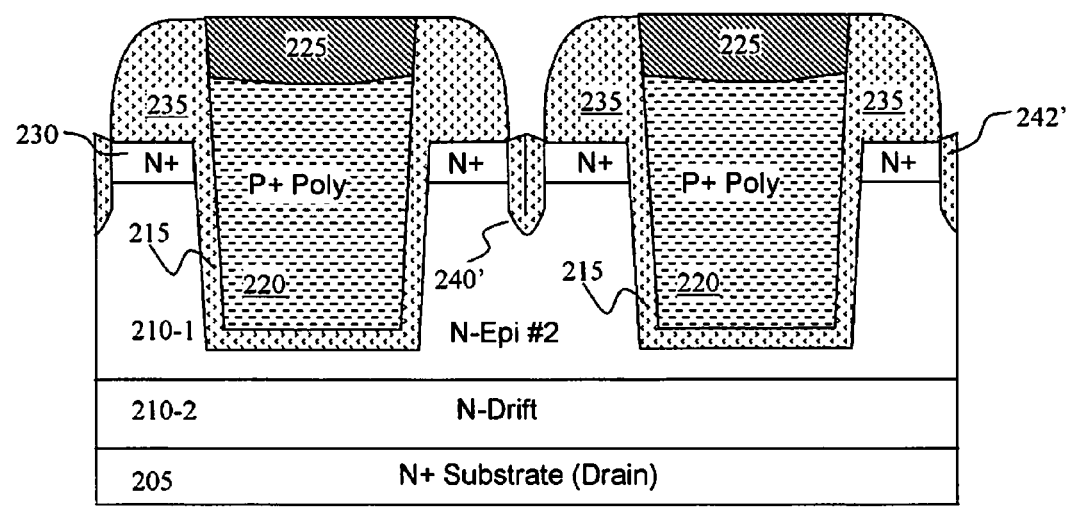
Figure 14K:
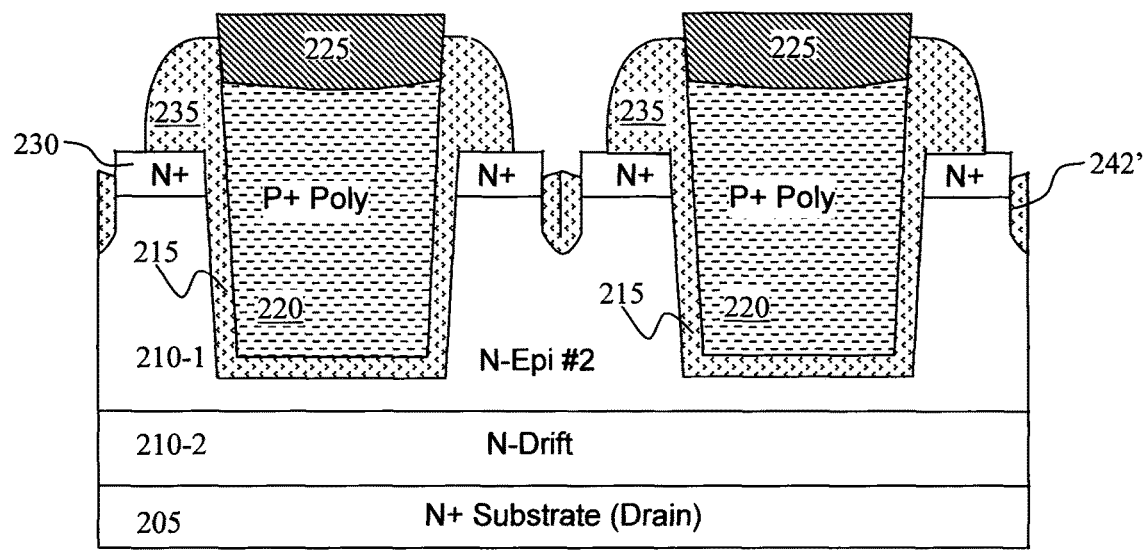
Figure 14L:
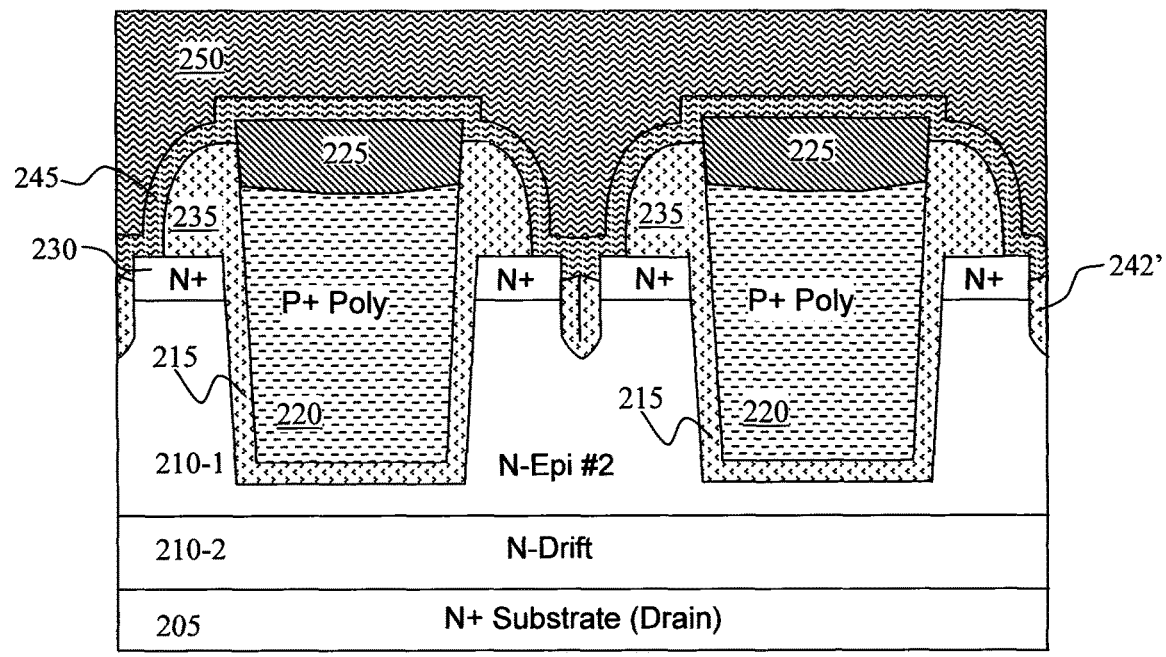

Referring to FIGS. 13A to 13M for a series of side cross sectional views to illustrate the fabrication steps to manufacture an alternate embodiment of an AccuFET device of this invention. The processing steps from FIGS. 13A to 13H are the same as that shown in FIGS. 10A to 10H. In FIG. 13I, shows a process of applying SF6 etchant for carrying out a selective silicon etch leaving only the oxide spacers 235 and the nitride gate cap 225. The etch depth is about two to three times the depth of the source regions 230 that is approximately 0.4 to 0.8 microns for a device with pitch equal or less than one micrometer thus forming the slots 238 between the oxide sidewall spacers 235. In FIG. 13J, a tilt boron implant is carried out with an implanting dose of 1E12 to 1E14 at an energy between 10 to 100 Kev, preferably 5E12 at 10 Kev, having a tilt angle of +/−seven degrees with rotation operation to implant the P-slot region 240' along the sidewalls of the slots etched between the spacers 235. An optional process may be carried out to form a shallow trench bottom boron implant region. In FIG. 13K, thermal oxidation process at a low temperature of 800-900 degree Celsius with steam is carried out to oxidize fill the slots 238 with oxide without impacting the spacers 235 and the P+ poly gate regions 220. The N+ source regions 230 grow more oxide through doping enhanced diffusion that closes the top region of the slot-gate 238. In FIG. 13L, an oxide select etch back is performed, e.g., by wet dilute BOE, to reduce the thickness of the spacer layer 235 of a thickness reduction between 200 Angstroms to 2000 Angstroms to expose the top surface of the source regions 230. In FIG. 13M, a barrier metal layer 245 is deposited over the top surface to enhance the contact to the source and the slotted gate regions. Then a metal layer 250 is deposited over the top surface and patterned into source metal 250-S and gate pads (not shown). The manufacturing processes completed with the formation of the passivation layer and final alloy processes (not specifically shown).

FIG. 14A to 14L shows an alternate exemplary embodiment manufactured by the same processing step as shown in FIGS. 13A to 13M. The only differences are the processing steps of the device shown in FIG. 14A to 14L skip the boron implants and the optional anneal process in the slot gate regions.

Figure 15A:
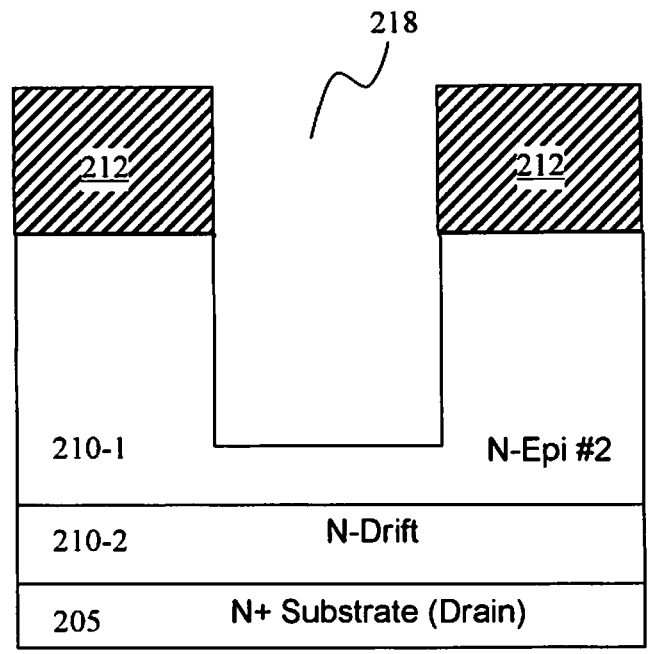
FIGS. 15A to 15K are a series of cross sectional views to illustrate processing steps of this invention to manufacture the AccuFET power device with Schottky implemented in every slot-gate.
Figure 15B:
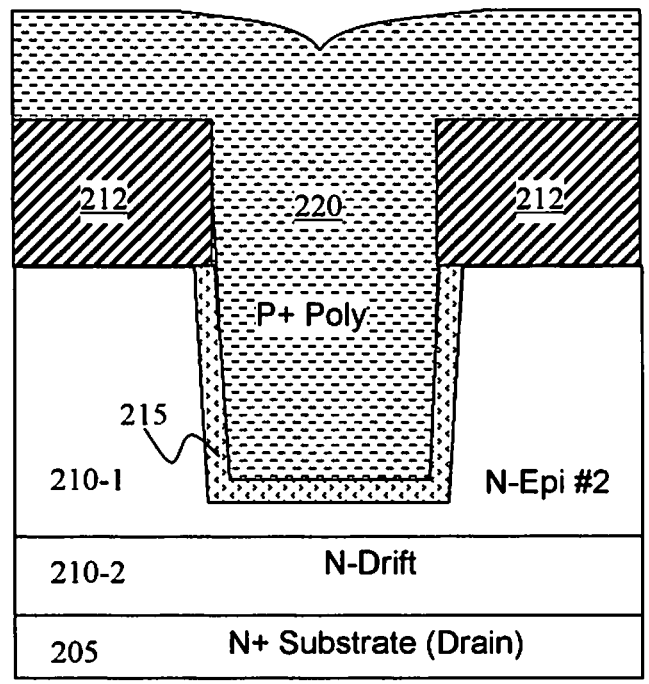
Figure 15C:
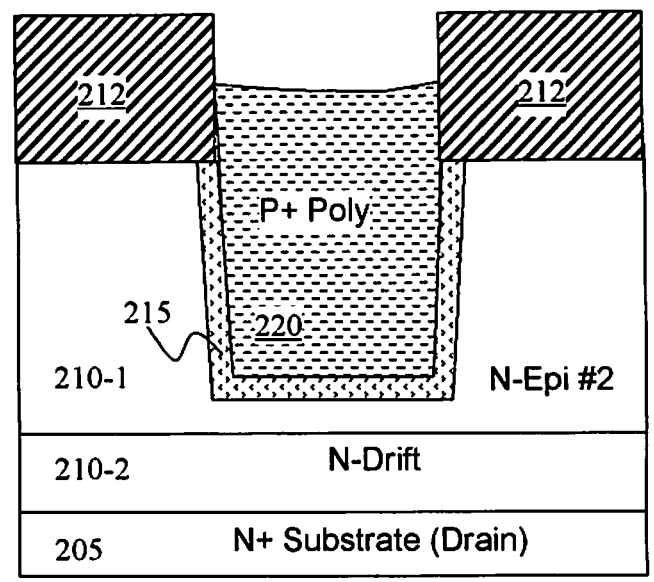
Figure 15D:
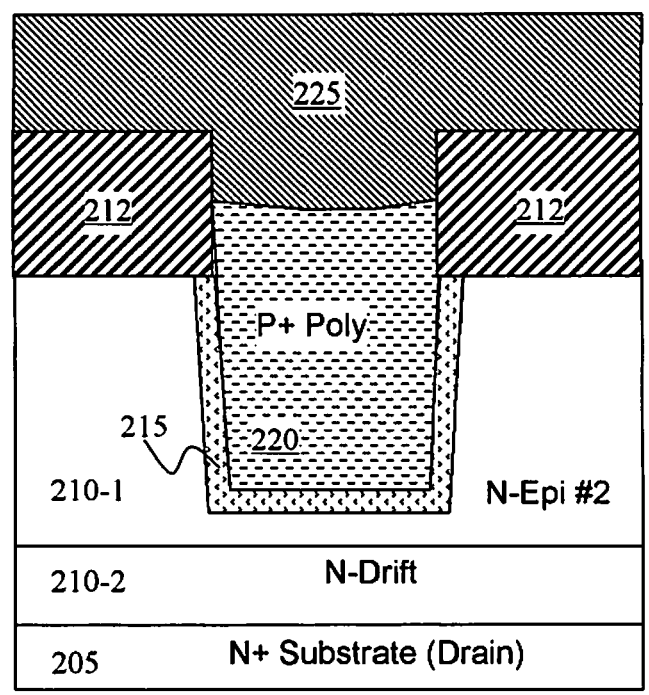
Figure 15E:
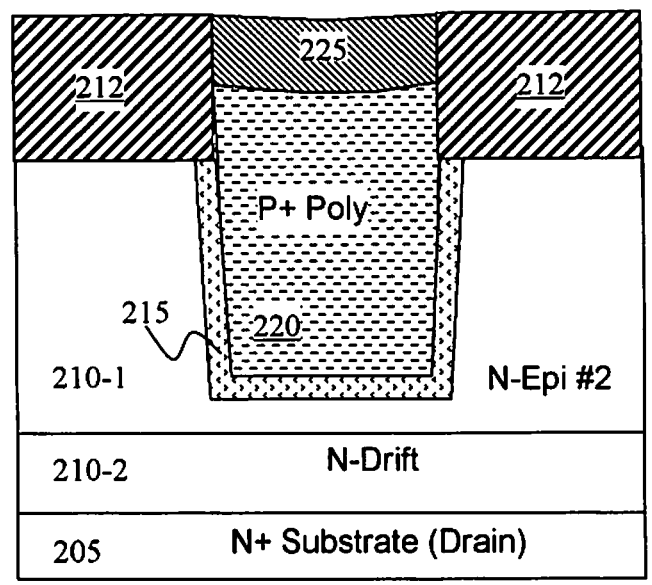
Figure 15F:
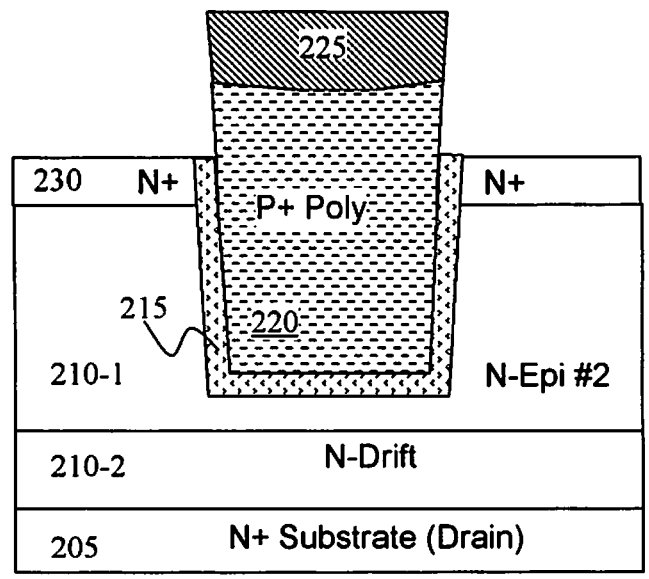
Figure 15G:
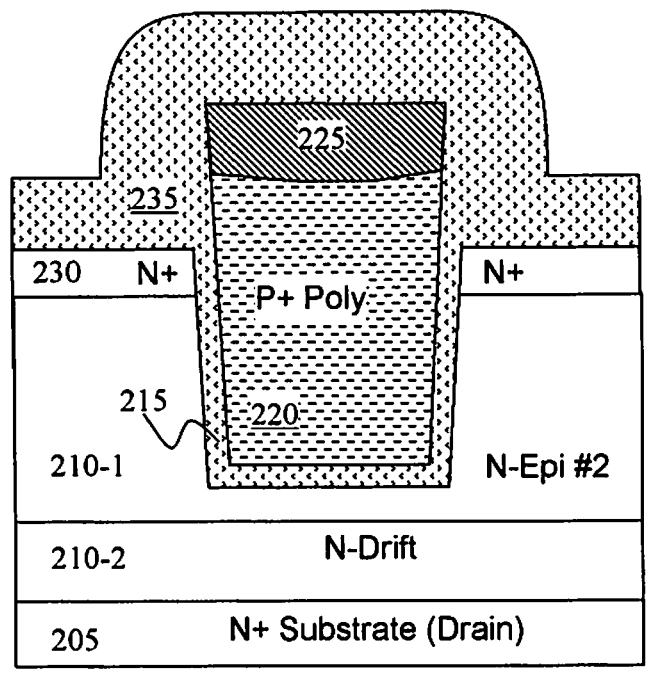
Figure 15H:
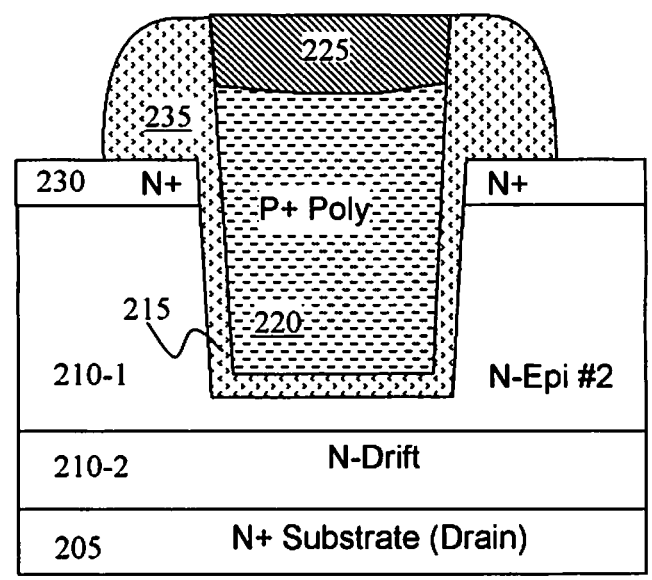
Figure 15I:
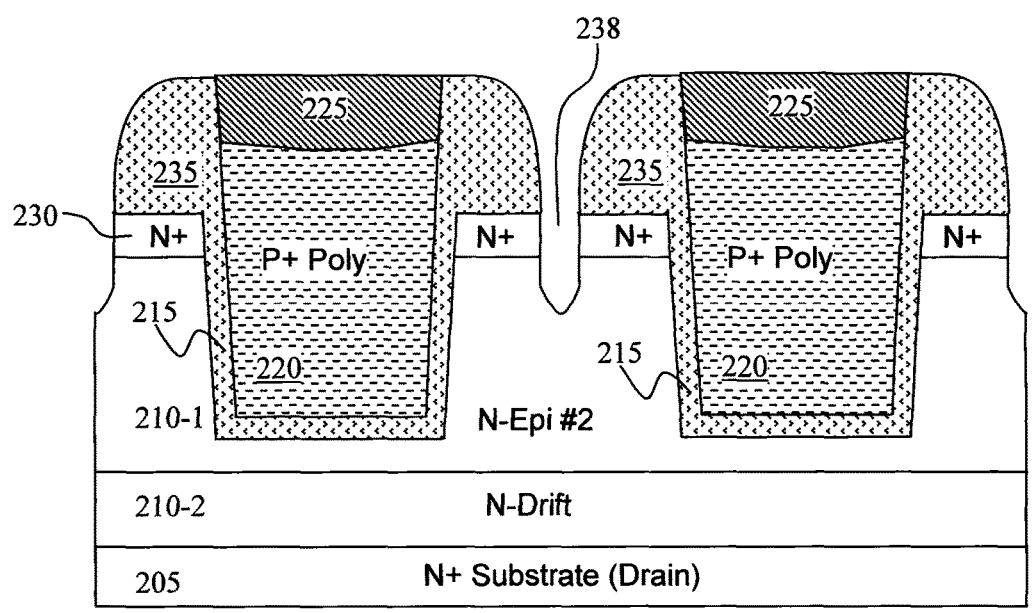
Figure 15J:
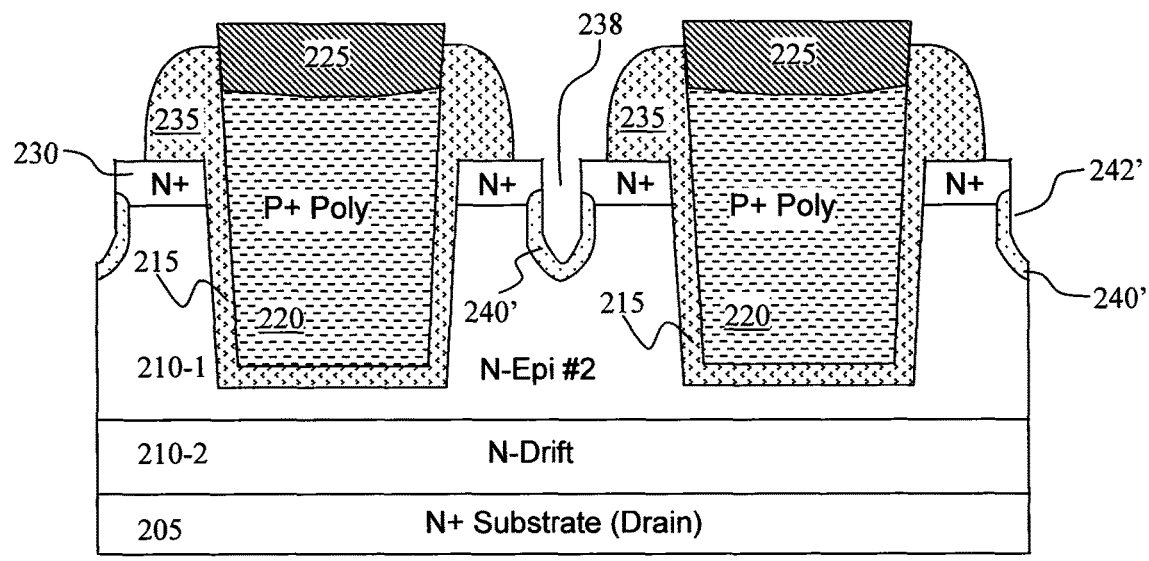
Figure 15K:
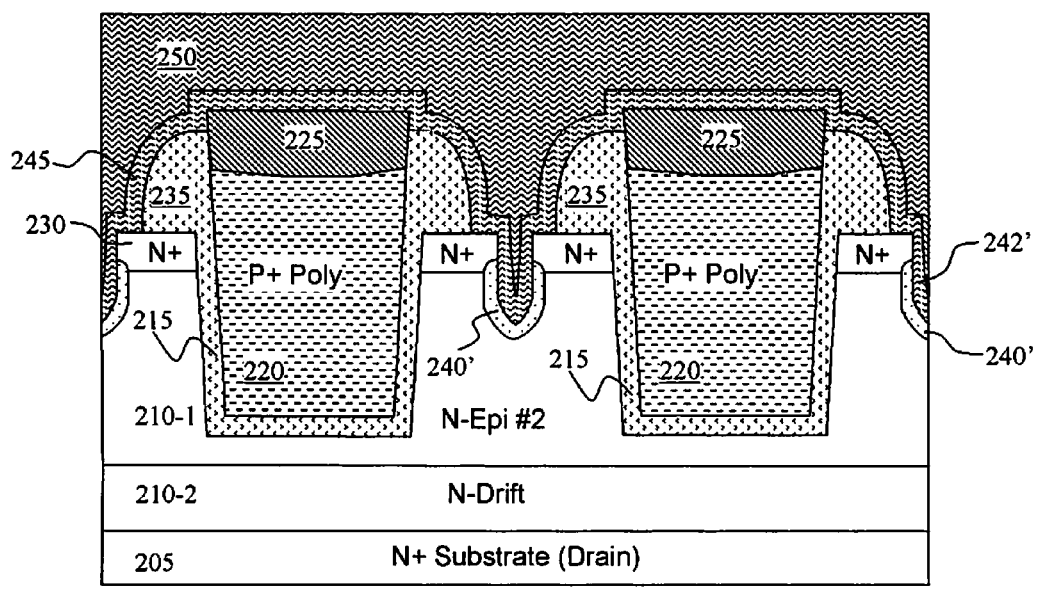

Referring to FIGS. 15A to 15K for a series of side cross sectional views to illustrate the fabrication steps to manufacture an alternate embodiment of an AccuFET device of this invention that has Schottky slot-gate in every cell. The processing steps from FIGS. 15A to 15H are the same as that shown in FIGS. 10A to 10H. In FIG. 15I, shows a process of applying SF6 etchant for carrying out a selective silicon etch leaving only the oxide spacers 235 and the nitride gate cap 225. The etch depth is about two to three times the depth of the source regions 230 that is approximately 0.4 to 0.8 microns for a device with pitch equal or less than one micrometer. In FIG. 15J, an oxide select etch back is performed, e.g., by wet BOE, to reduce the thickness of the spacer layer 235 of a thickness reduction between 200 Angstroms to 2000 Angstroms to expose the top surface of the source regions 230. In FIG. 15K, a barrier metal layer 245 is deposited over the top surface to enhance the contact to the source and the slotted gate regions and covering the slots between the sidewall spacers 235 followed by an annealing process. The barrier metal may be aluminum, Ti/TiN or Schottky barrier metal to provide an Schottky slot-gate in every cell.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An accumulation mode field effect transistor (AccuFET) semiconductor power device formed in a semiconductor substrate of a first conductivity type wherein the AccuFET comprising:
    trenched gates each having a stick-up gate segment extended above a top surface of said semiconductor substrate surrounded by sidewall spacers;
    slots opened substantially parallel to said trenched gates with source region of the first conductivity type and a lightly doped region of the first conductivity type below the source region separating the slots from said trenched gates with the trenched gate extending vertically below a bottom surface of the slots wherein the slots further comprises a sidewall doped region of a second conductivity type surrounding the sidewalls of the slots;
    said slots are filled with a conductive gate material doped with the second conductivity type for functioning as additional gate electrodes; and
    the sidewall doped regions surrounding said slots are doped with a P-type dopant and in an N-type epitaxial layer.

2. An accumulation mode field effect transistor (AccuFET) semiconductor power device formed in a semiconductor substrate of a first conductivity type wherein the AccuFET comprising:
    trenched gates each having a stick-up gate segment extended above a top surface of said semiconductor substrate surrounded by sidewall spacers;
    slots opened substantially parallel to said trenched gates with source region of the first conductivity type and a lightly doped region of the first conductivity type below the source region separating the slots from said trenched gates with the trenched gate extending vertically below a bottom surface of the slots wherein the slots further comprises a sidewall doped region of a second conductivity type surrounding the sidewalls of the slots;
    said slots are filled with a conductive gate material doped with the second conductivity type for functioning as additional gate electrodes; and
    the sidewall doped regions surrounding said slots are doped with a P-type dopant and in an N-type epitaxial layer and said slots are filled with a planarized doped polysilicon.

3. An accumulation mode field effect transistor (AccuFET) semiconductor power device formed in a semiconductor substrate of a first conductivity type wherein the AccuFET comprising:
    trenched gates each having a stick-up gate segment extended above a top surface of said semiconductor substrate surrounded by sidewall spacers;
    slots opened substantially parallel to said trenched gates with source region of the first conductivity type and a lightly doped region of the first conductivity type below the source region separating the slots from said trenched gates with the trenched gate extending vertically below a bottom surface of the slots wherein the slots further comprises a sidewall doped region of a second conductivity type surrounding the sidewalls of the slots; and
    the sidewall doped regions surrounding said slots are doped with a P-type dopant and in an N-type epitaxial layer and said slots are filled with a dielectric material.

* * * * *